(12) United States Patent
Nishigohri

(10) Patent No.: US 6,384,455 B1
(45) Date of Patent: May 7, 2002

(54) MOS SEMICONDUCTOR DEVICE WITH SHALLOW TRENCH ISOLATION STRUCTURE AND MANUFACTURING METHOD THEREOF

(75) Inventor: Masahito Nishigohri, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/163,362

(22) Filed: Sep. 30, 1998

(30) Foreign Application Priority Data

Oct. 1, 1997 (JP) .............................. 9-268674

(51) Int. Cl.$^7$ ............................................. H01L 29/76
(52) U.S. Cl. .................. 257/371; 257/285; 257/395; 257/396; 257/397; 257/513; 257/519; 257/545; 257/610; 257/611
(58) Field of Search ................................. 257/501, 506, 257/510, 513, 519, 545, 610, 611, 285, 369, 371, 374, 395–397

(56) References Cited

U.S. PATENT DOCUMENTS

| | | | | |
|---|---|---|---|---|
| 4,728,619 A | * | 3/1988 | Pfiester et al. ................. | 437/34 |
| 5,362,981 A | * | 11/1994 | Sato et al. ................... | 257/371 |
| 5,691,564 A | * | 11/1997 | Oyamatsu ................... | 257/509 |
| 5,763,921 A | * | 6/1998 | Okumura et al. ............ | 257/371 |
| 5,985,743 A | * | 11/1999 | Gardner ...................... | 438/527 |

* cited by examiner

Primary Examiner—Eddie Lee
Assistant Examiner—Matthew E. Warren
(74) Attorney, Agent, or Firm—Foley & Lardner

(57) ABSTRACT

A MOS IC device and a manufacturing method thereof capable of readily improving the isolation breakdown voltage while achieving a low threshold value and low junction capacitance with sufficient well-region separation breakdown voltage. To this end, a buried oxide film is deposited on a buried oxide film formed in a substrate while an oxide film is formed on the surface of the substrate. An ion decelerator layer of an appropriate material with a specified thickness is selectively disposed only on part of the substrate overlying the well boundary region; then, first ion implantation and second ion implantation steps are carried out. Accordingly, as compared to those regions other than the well boundary region, the resultant well profile in the well boundary region is shifted in position or "offset" towards a shallower part. Appropriately adjusting the implantation condition permits a retrograde well, which inherently has its peak near the bottom of the buried oxide film, to become shallower only in the well boundary region to thereby enable elimination of unwanted inversion of a parasitic MOS transistor element.

4 Claims, 34 Drawing Sheets

MOS SEMICONDUCTOR DEVICE WITH SHALLOW TRENCH ISOLATION STRUCTURE AND MANUFACTURING METHOD THEREOF

FIELD OF THE INVENTION

The present invention relates in general to semiconductor technologies and, in particular, to complementary metal oxide semiconductor integrated circuit (CMOS IC) devices and manufacturing methods thereof. More particularly, but not exclusively, this invention relates to a method of controllably forming a well impurity profile at or near well boundaries or interfaces in semiconductive substrates.

BACKGROUND OF THE INVENTION

An explanation will first be given of problems faced with prior known well-region formation technologies in conjunction with one typical case of a CMOS integrated circuit (IC) device. The explanation begins with a brief description of some major process steps in the manufacture of such CMOS IC including element isolation and well formation procedures with reference to FIGS. 1 to 5.

Referring to FIG. 1, a substrate 101 has its surface on which a buffer oxide film 102 is formed to a thickness of, for example, 35 nanometers (nm). In this case the substrate 101 may be of either N type or P type. Then, a first stopper layer 103 is deposited by chemical mechanical polishing (CMP) techniques on the buffer oxide film 102. The stopper 103 is made of a chosen material less in polishing rate than oxide films, such as SiN or polycrystalline silicon (polysilicon). Next, a mask layer (not shown) is deposited such as tetra-ethylorthosilicate (TEOS) oxide film or the like.

The resultant structure is coated with a resist layer (not shown) on the mask layer, which resist is then subject to patterning in a way such that the resist is partly removed away in selected regions in which grooves, called "trenches" 104, are to be formed. Subsequently, the mask material is selectively removed. Thereafter, the resist is peeled off for sequential etching of the first stopper 103 and buffer oxide film 102 in this order; further, trenches 104 are formed in the substrate 101 as shown in FIG. 1.

Then, as shown in FIG. 2, the inner walls of each trench 104 are oxidized, causing an oxide film 105 of TEOS or the like to be deposited within the trench 104, thereby providing a buried oxide film. And, a chosen material that is low in polishing rate is deposited, which is then selectively removed at locations other than certain regions in which the trenches 104 of large area exist, to thereby form a second stopper layer. Note that the second stopper material is not depicted herein in view of the fact that such will not be required when the large-area trenches are absent. Thereafter, the resulting device structure is subject to surface planarization using CMP techniques.

Then, as shown in FIG. 3, the first stopper layer 103 is peeled off.

Then, as shown in FIG. 4, a well region of N type conductivity (N-well) 106 is formed in a substrate region in which a P-type transistor is to be formed, whist a P-type well (P-well) 107 is defined in a region selected for formation of an N-type transistor therein. Ion implantation is then performed with respect to those regions that will become channels in such a way as to permit each transistor to have a desired electrical characteristics. When this is done, the impurity profile is controlled in a way as will be described later.

After the buffer oxide film 102 is removed away from the overall surface of the substrate 101, a gate oxide film 108 is formed on the surface of substrate 101; then, a gate electrode 109 is formed thereon. Subsequently, ion implantation is done, forming a lightly doped drain (LDD) (not shown) in the surface of the substrate 101. After sidewalls 110 are formed, ion implantation and thermal processing are carried out, forming diffusion layers 111 and 112.

Then, as shown in FIG. 5, a dielectric film 113 made of SiO2 or the like is deposited as a first interlayer film. This dielectric film 113 is selectively removed in those regions for use in forming contact holes for electrical interconnection. Here, a first lead wire pattern 114 is formed, which may be a chosen conductive material.

Thereafter, second and third interlayer dielectric films may be formed along with chip lead patterns where necessary, although these are not depicted herein. After formation of these lead patterns, a protective film 115 made of SiN or the like is formed overlying the resultant surface, to thereby complete a CMOS IC device.

An explanation will next be given of the element isolation breakdown voltage at well boundaries as well as a scheme for maintaining the breakdown voltage.

FIGS. 6 to 8 are diagrams each illustrating, in cross-section, the well structure near the boundary of a well region of the CMOS IC as manufactured through the process steps shown in FIGS. 1–5. Parts or components identical to those of FIG. 5 are designated by identical reference numerals, and an explanation thereof will be omitted herein.

Suppose that in the state shown in FIG. 6, a bias voltage VN of the positive polarity is applied to a heavily doped N type (N+ type) diffusion layer 112 in a P-well 107 while the N-well 106 and P-well 107 are biased at zero volts. In this case, the junction between N+-diffusion layer 112 and P-well 107 is in the "reverse" direction, wherein no currents attempt to flow therein. However, as the bias voltage VN increases in potential value, a depletion layer 117 between the N+-diffusion layer 112 and P-well 107 behaves to expand toward the P-well 107, as designated by arrow "A" in FIG. 6.

Then, as shown in FIG. 7, the P-well 107 laid between the N+-diffusion layer 112 and N-well 106 is fully depleted. When this is done, punch-through can take place between the N+ diffusion 112 and N-well 106, causing a current to flow in the direction denoted by arrow C1. The potential value of bias voltage VN at this time is called the "isolation breakdown" voltage among those skilled in the semiconductor art.

Obviously, the isolation breakdown voltage must be significant relative to the power supply voltage used. To potentially increase the breakdown voltage, it should be required that the trench increase in depth lengthening the isolation/separation distance (denoted by arrow B1 in FIG. 6); or alternatively, the P-well 107 is required to increase in impurity concentration thereby limiting the expansion of the depletion layer 117. Note here that an approach for increasing the trench width in order to lengthen the separation distance is not preferable in view of the integration density; accordingly, this approach is not practiced excessively. For example, assume that the trench depth is 0.7 micrometers ($\mu$m), the separation width is 0.4 $\mu$m, and the power supply voltage used is 3.3 volts. If this is the case, impurity concentration might be designed permitting a peak concentration of 1.0 to $5.0 \times 10^{17}$ atoms per cubic centimeter (cm-3) to appear at or near the bottom of each trench—namely at the depth of 0.8 to 0.9 $\mu$m).

Next, consider that the N-well 106 is biased at VNW (positive bias voltage) whereas the N+-diffusion layer 112 within P-well 107 and the P-well 107 are kept at zero volts, as shown in FIG. 8. In this case, a multilayer structure consisting of the N-well 106 and buried oxide film 105 plus P-well 107 is equivalent to the gate/gate-oxide/P-well structure in N type MOS (NMOS) devices, wherein upon biassing of the N-well 106, certain part of the P-well 107 along the trench side surface acts to invert as shown by wavy line D in FIG. 8, forming a channel. Thus, a current attempts to flow in the direction designated by arrow C2. This results in operation of a vertical-structured parasitic MOS transistor. When this is done, the effective separation distance designated by arrow B2 in FIG. 8 decreases, lowering the isolation breakdown voltage accordingly.

More specifically, when comparing the case of biasing the N+ diffusion layer 112 within the P-well 107 to the case the N-well 106 is biased, the latter tends to exhibit a decrease in breakdown voltage. One way of improving the breakdown voltage in the latter mode is to increase the threshold value of such inherent parasitic MOS transistor element by increasing the impurity concentration of P-well 107 to thereby decrease the risk of inversion. This can be said because even when the trench is rendered deeper, the effective separation distance is kept unchanged if the parasitic MOS transistor becomes operative.

FIGS. 9–10 are graphs demonstrating a profile of impurity concentration distribution in the P-well as modified to suppress the operability of the vertical parasitic MOS transistor stated supra, wherein FIG. 9 shows the profile before modification whereas FIG. 10 shows the profile after modification.

As apparent from viewing FIG. 9, the "native" profile before modification is low in well concentration in the substrate surface, which would result in the so called "retrograde-well" region capable of achieving reduced threshold value and low junction capacitance. To suppress or eliminate the operation of a parasitic MOS transistor element, it may be effective to add ion implantation process, permitting the resultant profile to have an impurity peak at or near a location with its depth half of the trench depth. One example is that where a well profile has its impurity peak of approximately 1.0 to $5.0 \times 10^{17}$ cm$^{-3}$ at the depth of 0.8 to 0.9 $\mu$m, additional ion implantation is performed correcting the well profile so that it has a peak at the depth approximately half the trench depth, i.e. 0.3 to 0.4 $\mu$m deep.

Unfortunately, this does not come without accompanying a penalty: in the case the well profile is so modified, the resulting impurity concentration at the substrate surface does increase relative to the "original" retrograde well region as shown in FIG. 10. This makes it impossible to reduce the threshold value, which in turn results in an undesired increase in diffusion junction capacitance, which can lead to a serious bar to the operability of a CMOS IC device.

An explanation will then be given of a technique for separately forming well regions using separate masks in order to avoid the aforesaid problems.

FIG. 11 depicts, in cross-section, a semiconductor device at a stage immediately after completion of the well region formation process. At this time, as shown in a well profile of FIG. 13, the individual well region remains uniform in impurity concentration as a whole, and thus is considered as a retrograde well.

Then, as shown in FIG. 12, the structure is subject to patterning process by use of a resist 119 to ensure that ions are doped or implanted into only selected portions of the N-well region 106 and P-well region 107 near or around the well boundary or "interface" at a later lithography process step. Subsequently, ions are additionally doped by ion implantation techniques causing the resultant structure to exhibit the well profile shown in FIG. 10. In this case, the resulting well profile of the remaining part of N-well region 106 other than the well boundary region is as shown in FIG. 14. A well profile of an N-well region 116 at the well boundary is as shown in FIG. 15.

With the foregoing approach, the intended low threshold value and low junction capacitance may be achievable because the well profile of those regions other than the well boundary region remains unchanged. However, this prior art approach is encountered with a problem—two extra masks and two separate lithography process steps should be required as those skilled in the art would readily appreciate that the prescribed process must be applied to the individual one of the N-well and the P-well in a way independent of each other. In addition, by taking account of execution of such extra lithography procedures with extra masks used, this approach is difficult in successful reduction to practice due to the risk of unacceptable position alignment deviations during such repetitive processing.

It has been described that while it is required that the impurity concentration of well regions be set higher in order to eliminate a decrease in isolation breakdown voltage due to unwanted operation of an inherently existing vertical parasitic MOS transistor element near the well boundary, such increase in well impurity concentration would result in difficulty of low threshold value attainability while undesirably increasing the junction capacitance concerned. In addition, while the breakdown voltage is improvable by adding ion implantation process for the well boundary region only, this approach suffers from the need for additional masks and extra process steps, thus increasing complexity of the CMOS-IC fabrication.

SUMMARY OF THE INVENTION

It is therefore an object of the present invention to provide an improved semiconductor device and its manufacturing method capable of readily improving the isolation breakdown voltage while achieving low threshold value and low junction capacitance, by attaining by an easy method a well structure with "variable" well concentration which is high at or near well boundary regions and yet low in element formation regions.

To attain the foregoing object, the present invention provides a method for manufacturing a MOS semiconductor device, which method is featured by including a first step of forming a groove in an element isolation region of a semiconductor substrate, a second step of burying an element isolation dielectric film within the groove, a third step of selectively depositing an ion deceleration material on part or parts of the element isolation dielectric film between an element formation region of a first conductivity type and an element formation region of a second conductivity type, which material is to slow or decelerate those ions being doped or implanted into the element formation regions of the first and second conductivity types at locations near the interface between these regions and the element isolation dielectric film, a fourth step of performing first ion implantation for a respective one of the element formation regions of the first and second conductivity types to thereby form a well region in therein, and a fifth step of doing second ion implantation for each of the element formation regions with a profile different from that of the first ion implantation.

In accordance with another aspect of this invention, a CMOS semiconductor device manufacturing method is featured by including a first step of selectively forming a deposition film in an element formation region of a first conductivity type and an element formation region of a second conductivity type in a semiconductor substrate, a second step of forming a groove in an element isolation region of the semiconductor substrate in the state that the deposition film was formed in the element formation regions of the first conductivity type and second conductivity type of the semiconductor substrate, a third step of depositing an element isolation dielectric film on the semiconductor substrate including the groove interior, a fourth step of causing the element isolation dielectric film to regress or "retrograde" with the deposition film being as a stopper to the extent that an entire surface of the semiconductor substrate is planarized, a fifth step of permitting the element isolation dielectric film to project for deceleration of ions being implanted at nearby locations of an interface between each of the element formation regions of the first and second conductivity types and the element isolation dielectric film during ion implantation to the element formation regions of the first and second conductivity types with the resultant exposed deposition film removed away, a sixth step of performing first ion implantation to form a well region in a respective one of the element formation regions of the first and second conductivity types, and a seventh step of performing second ion implantation for the element formation regions with a profile different from that of the first ion implantation.

In accordance with a further aspect of the invention, a semiconductor device includes a semiconductor substrate, an element formation region of a first type conductivity and an element formation region of a second type conductivity in the semiconductor substrate, a groove as formed between the element formation region of the first type conductivity and the element formation region of the second type conductivity, an element isolation dielectric film deposited in the groove, and a first region in close proximity to the element isolation dielectric film in the element formation region of the first type conductivity, and a second region different from the first region in the element formation region of the first type conductivity, wherein the first region has an impurity concentration profile with a first concentration peak laid midway between the substrate surface and the bottom of the groove and further with a second concentration peak near the groove bottom.

One significant feature of the invention lies in that the ion implantation is performed after disposal of either an ion deceleration film of a chosen material with a preselected thickness or a projection portion of the element isolation dielectric film only at selected part of the element formation regions, which part may overlie the well boundary region. This may result in that the concentration peak of the well profile at a well boundary or interface is positionally shifted or "offset" toward a shallower location from the semiconductor substrate surface. With such an arrangement, while the impurity concentration peak inherently appears at or near the bottom of the buried element isolation region, appropriate adjustment of the ion implantation condition forces the peak of impurity concentration profile to be offset toward the shallower location solely in the well boundary region in which a retrograde well is present, thus making it possible to eliminate—or at least greatly suppress—inversion of a parasitic MOS transistor component, which in turn enables decrease of masks and process steps required.

Other objects, features, and advantages of the present invention will become apparent form the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the present invention and many of its attendant advantages will be readily obtained by reference to the following detailed description considered in connection with the accompanying drawings, in which:

FIGS. 9–10 are graphs each showing a distribution of impurity concentration along the depth of a device substrate for explanation of the scheme for modifying a profile of a P type well region to suppress operability of a vertical parasitic MOS transistor element shown in FIG. 5, wherein FIG. 9 shows a well profile before modification whereas FIG. 10 is a well profile after modification.

FIGS. 13–15 are graphs showing some typical impurity concentration profiles, wherein FIG. 13 shows a well profile of the CMOS IC device of FIG. 11, FIG. 14 shows a well profile in a region excluding the well boundary region of the CMOS IC of FIG. 1, and FIG. 15 shows a well profile in the well boundary region of the CMOS IC of FIG. 12.

FIGS. 26–27 are graphs each showing a distribution of impurity concentration along the depth of a device substrate for explanation of the way for modifying a profile of a P-well region to reduce operability of a vertical parasitic MOS transistor element, wherein FIG. 26 shows a well profile before modification whereas FIG. 27 is a well profile after modification.

DETAILED DESCRIPTION OF THE PREFERRED EMBODIMENTS

Preferred embodiments of the present invention will be explained with reference to the accompanying drawings.

Figure 1:
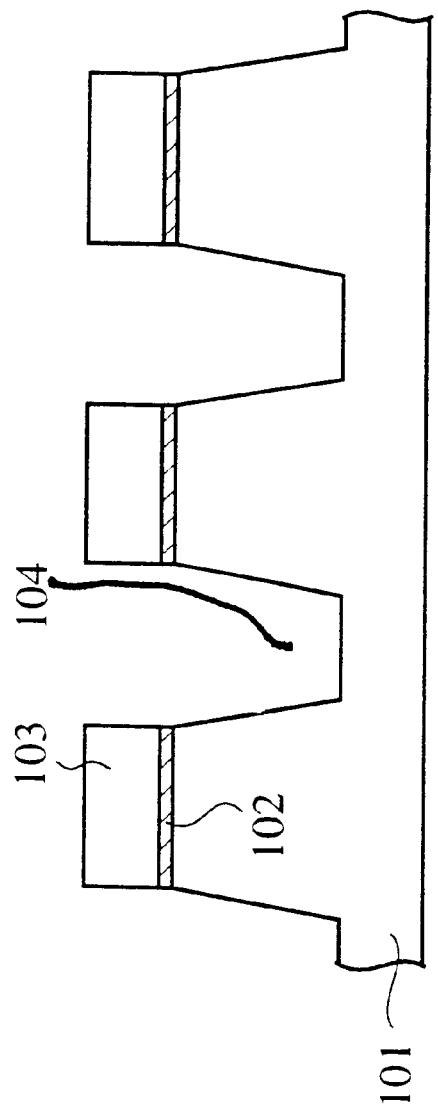
FIGS. 1 through 5 illustrate, in cross-section, some of the major steps in the manufacture of a prior art semiconductor device.
Figure 2:
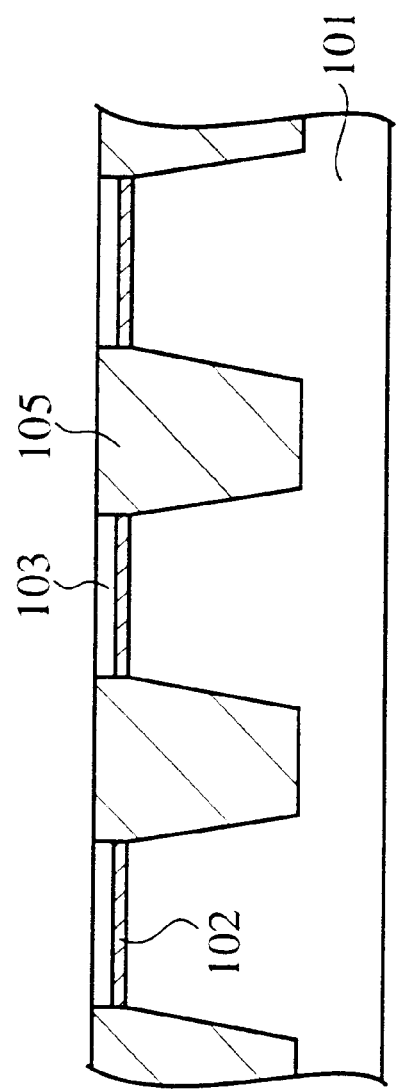
Figure 3:
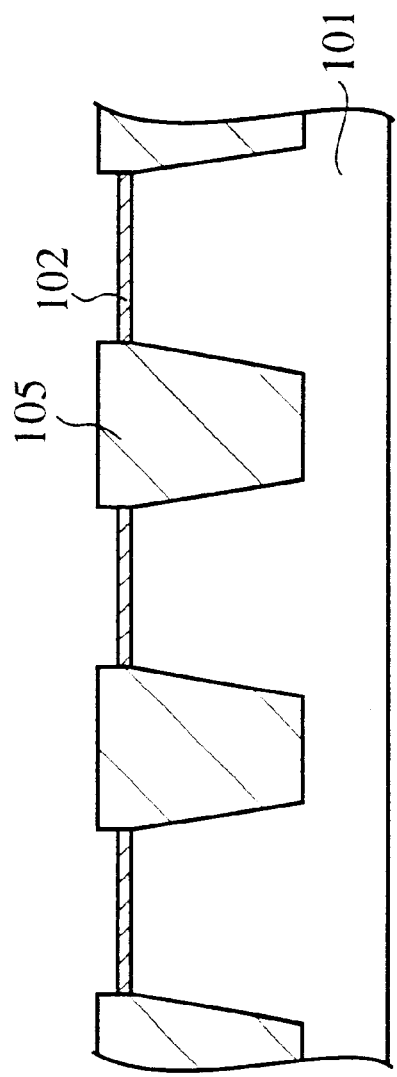
Figure 4:
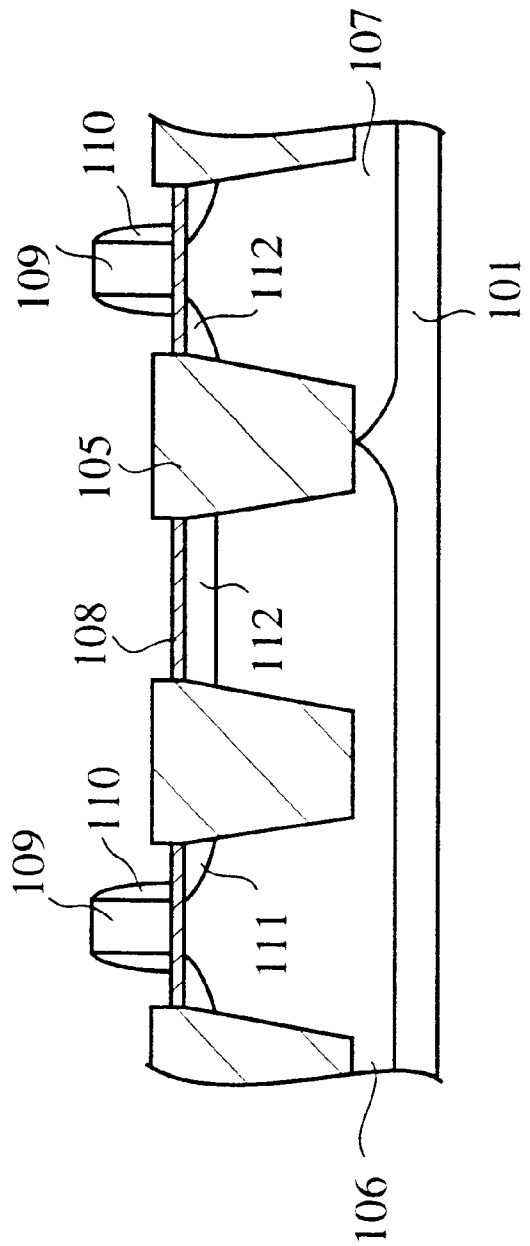
Figure 5:
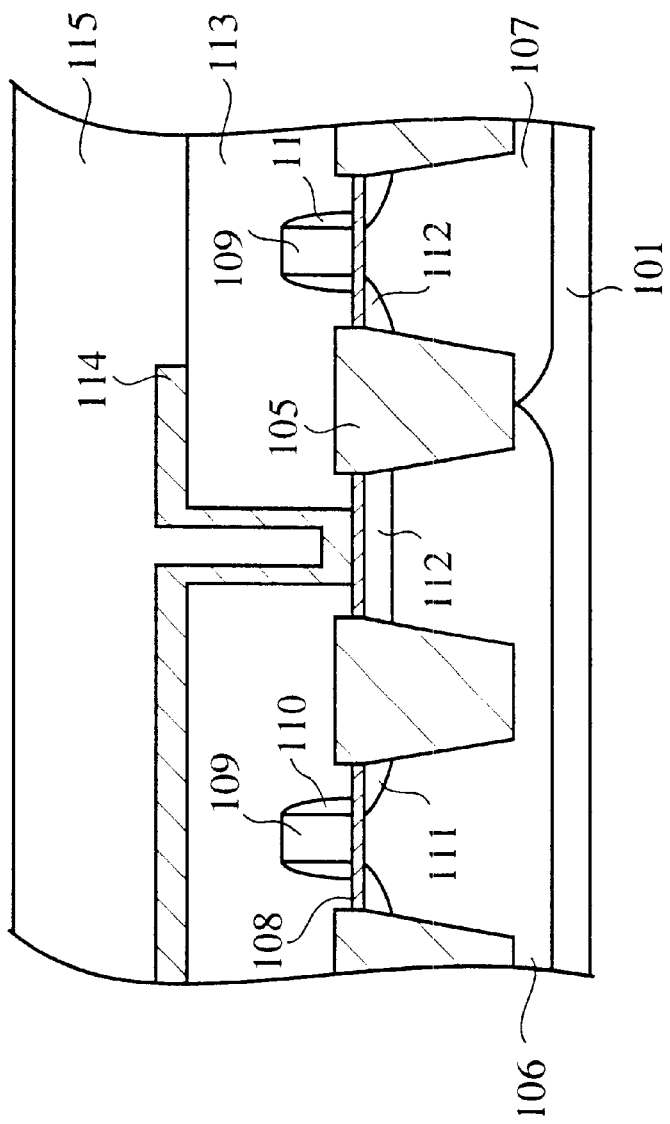
Figure 6:
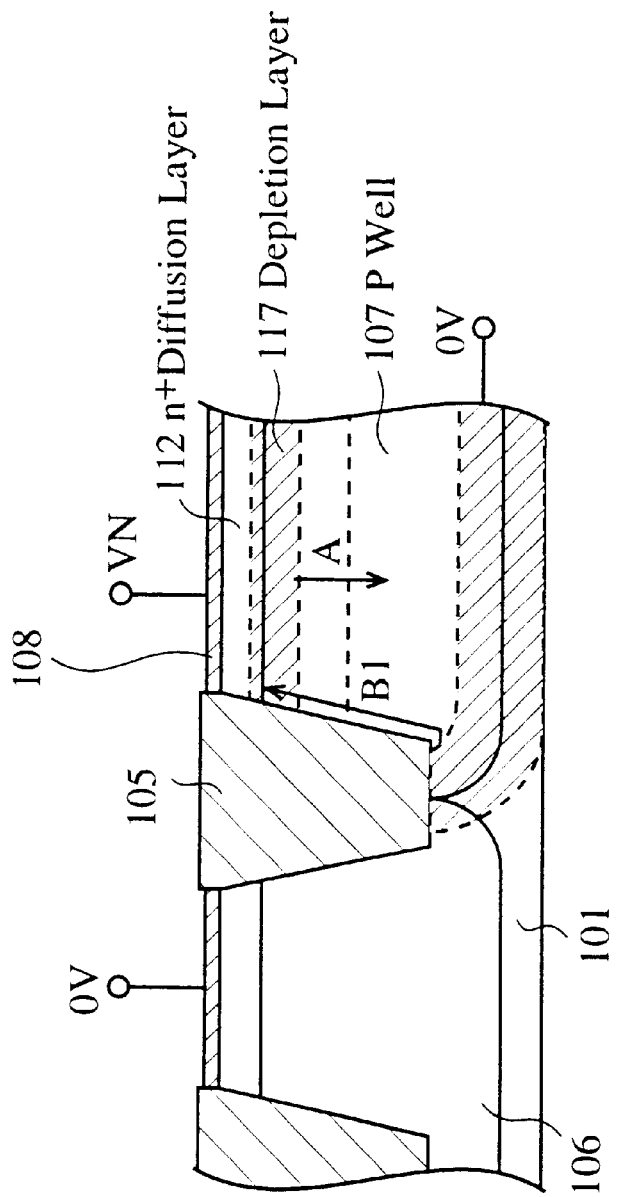
FIGS. 6 to 8 are sectional views of a semiconductor device shown in FIG. 5 for explanation of the isolation breakdown voltage characteristics at a well boundary of the device.
Figure 7:
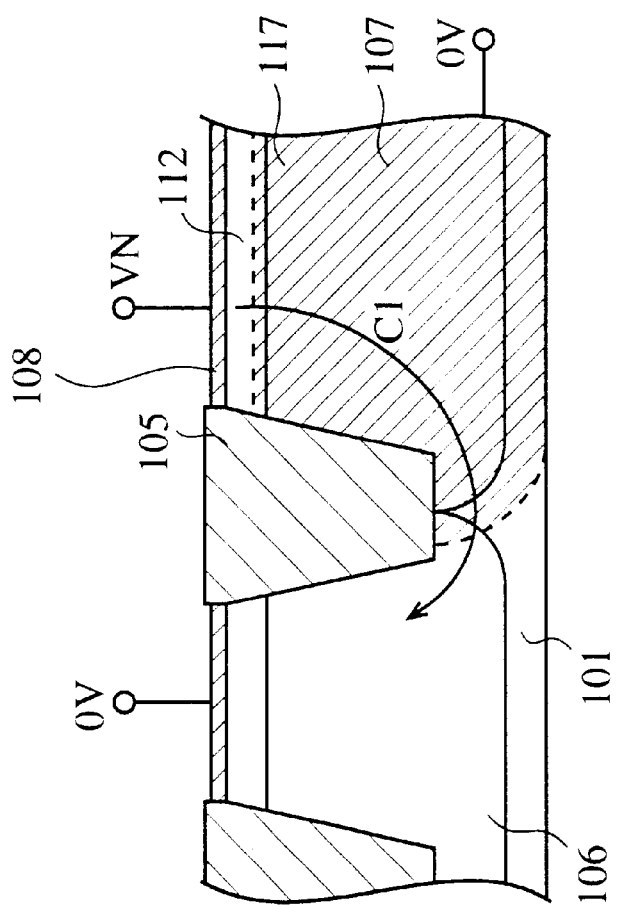
Figure 8:
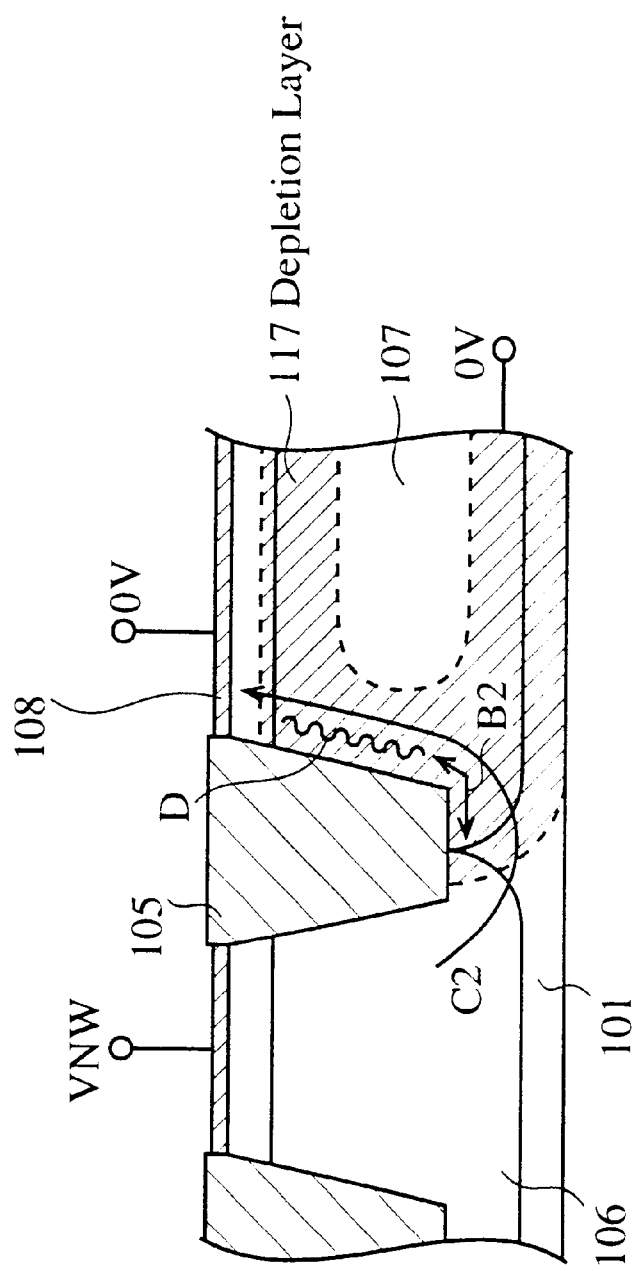
Figure 9:
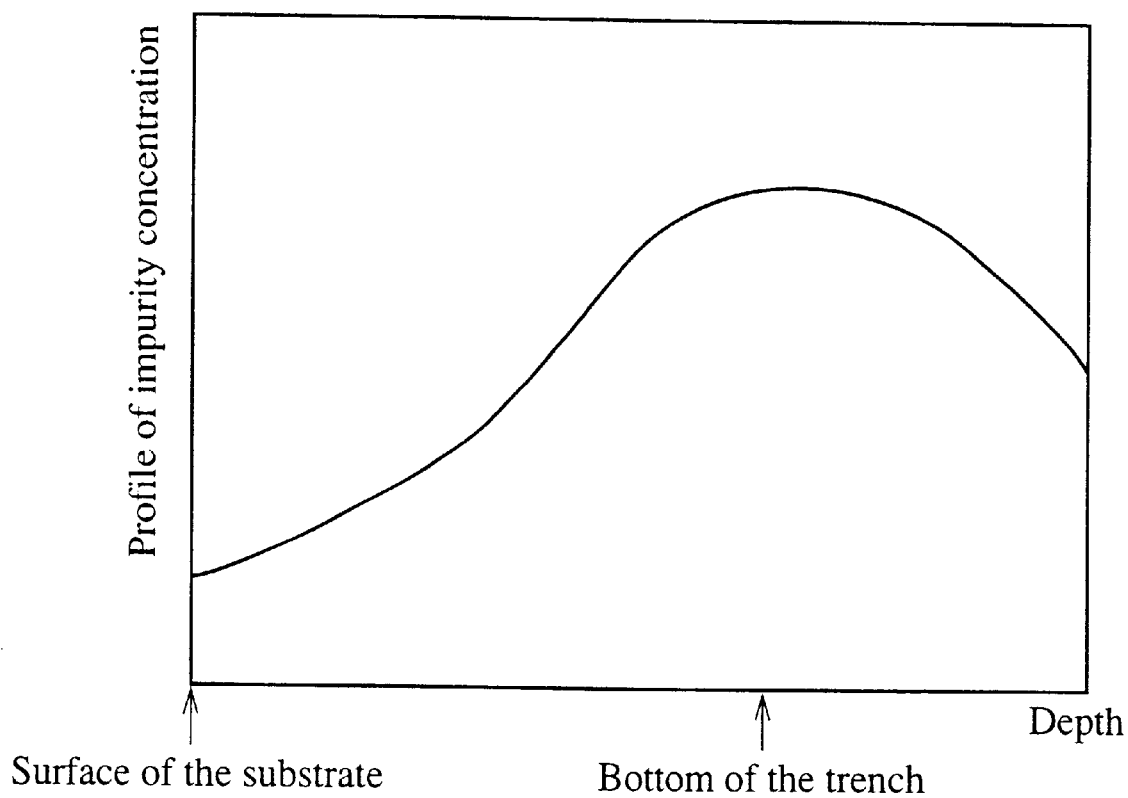
Figure 10:
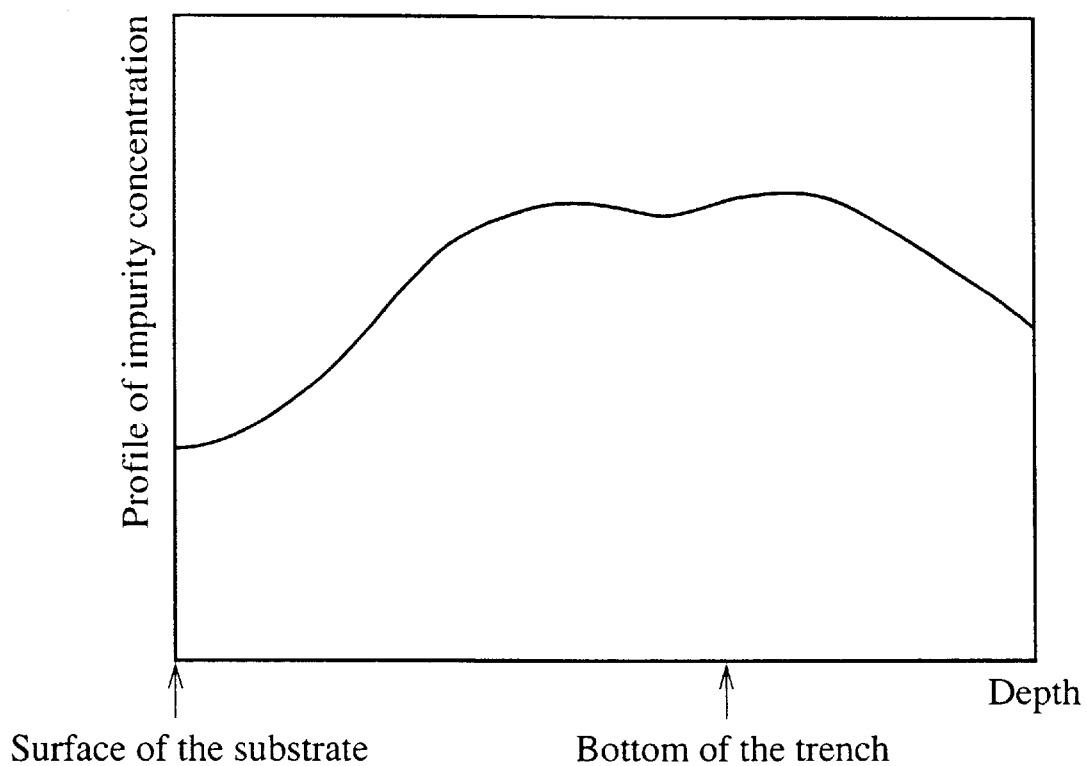
Figure 11:
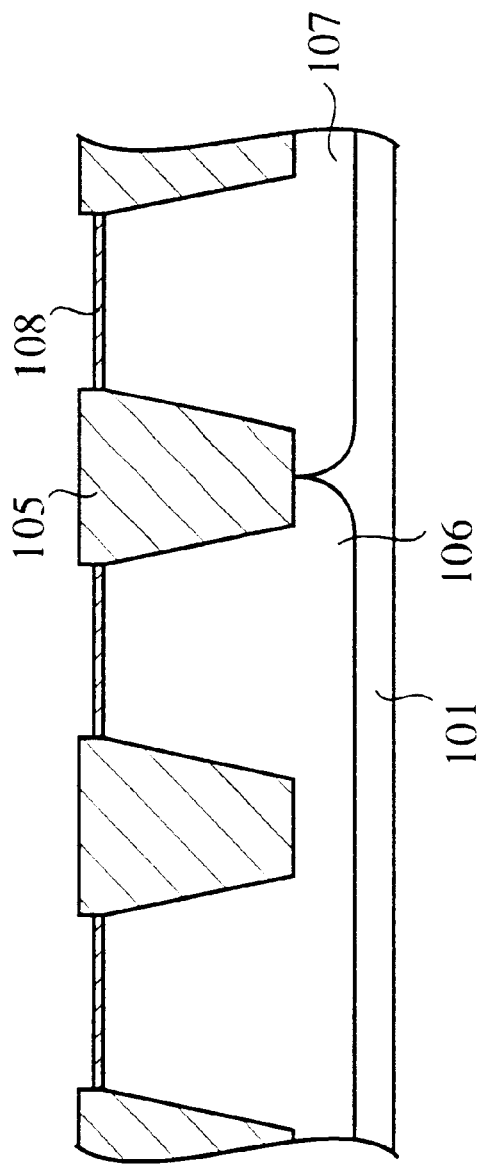
FIGS. 11–12 illustrate, in cross-section, some of the major steps in the manufacture of a prior art semiconductor device.
Figure 12:
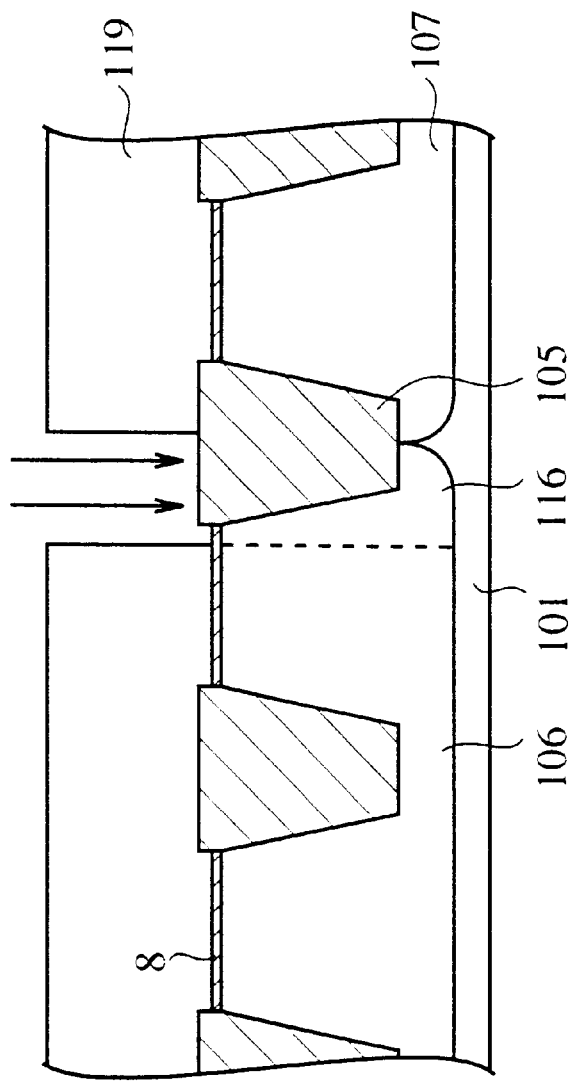
Figure 13:
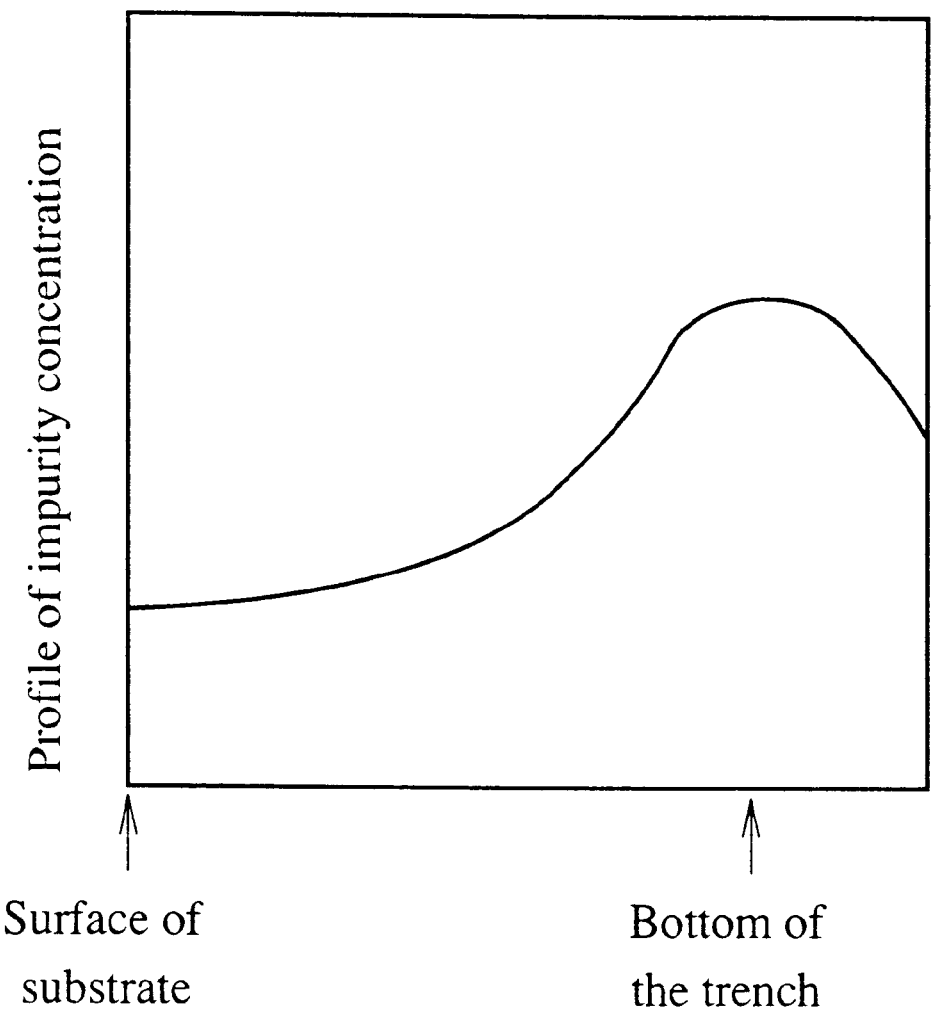
Figure 14:
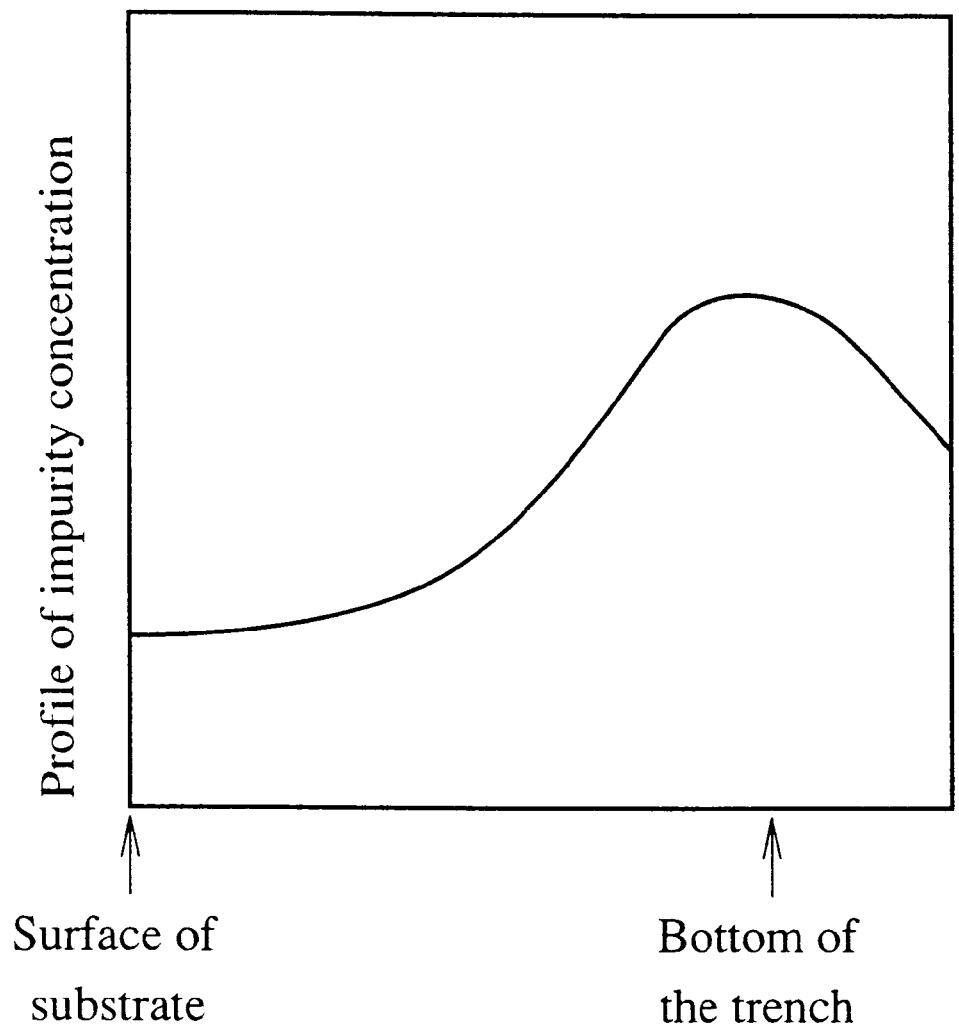
Figure 15:
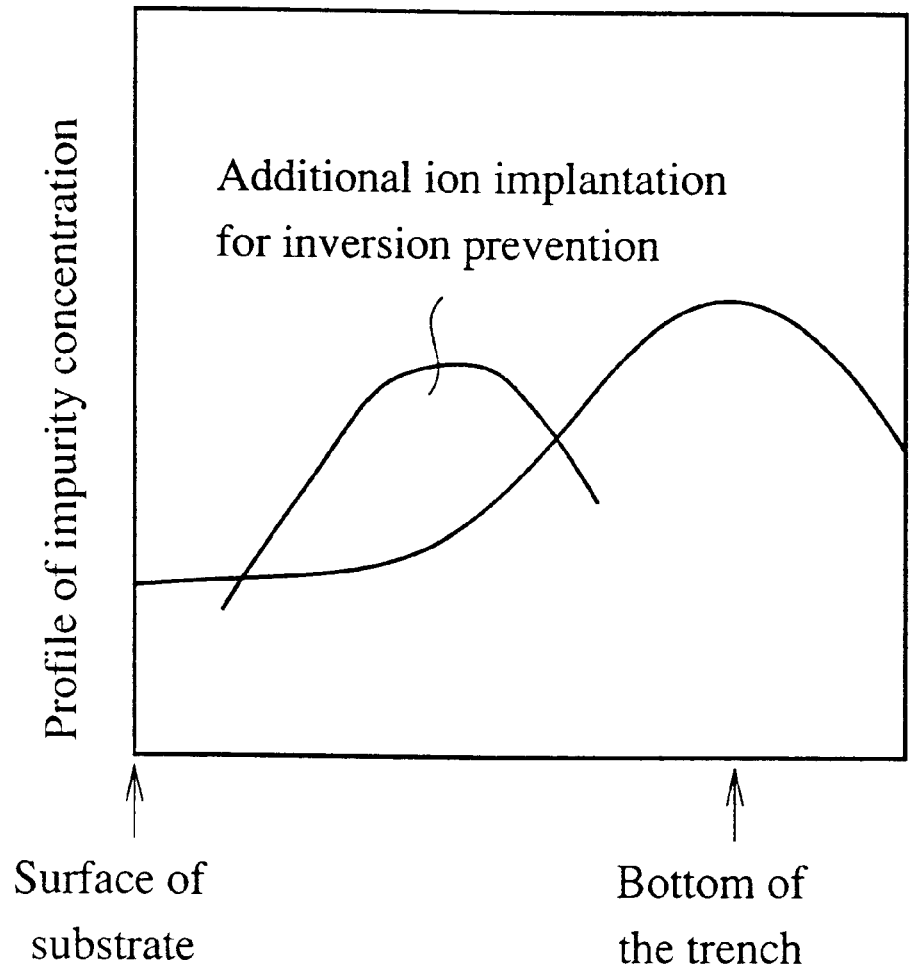
Figure 16:
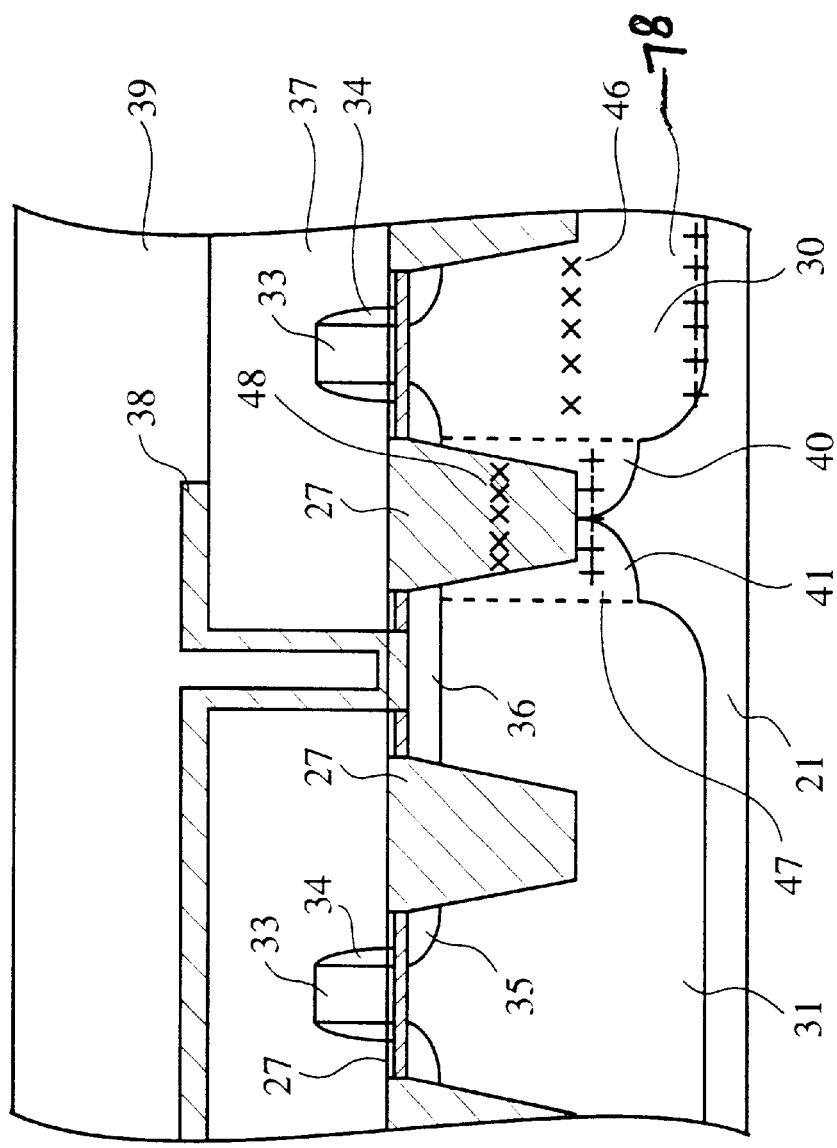
FIG. 16 is a diagram depicting a sectional view of a semiconductor device in accordance with one preferred embodiment of the present invention.

FIG. 16 illustrates, in cross-section, a CMOS semiconductor device in accordance with a first embodiment of the invention. The CMOS semiconductor device shown has a semiconductor substrate 21 with a P type well region 30 and N type well region 31 being formed therein. A groove called a "trench" is formed in an element isolation region between the P-well region 30 and N-well region 31. An element isolation dielectric film 27 is deposited or "buried" in the trench. The CMOS semiconductor device further includes a first region 40 within the P type well region 30 at a location near or around the element isolation dielectric film 27. A second region 41 is formed in the N-well region 31.

The first region 40 in P type well region 30 has its impurity concentration profile, which has a first concentration peak 48 at an intermediate level of the element isolation dielectric film 27 along the depth thereof—namely, midway between the substrate surface and element isolation dielectric film 27. The profile also has a second concentration peak 47 in close proximity to the bottom of the element isolation dielectric film 27. The N type well region 30 has its surface in which a lightly-doped well region less in impurity concentration (retrograde well region) is formed along with a third concentration peak 46 and a fourth concentration peak 78. The first concentration peak 48 and third peak 46 are formed at the same ion implantation step, wherein the third peak 46 is formed at a level deeper from the substrate surface than the first peak 48. The second concentration peak 47 and fourth peak 78 are formed during the same ion implantation process, wherein the fourth peak 78 is at a level deeper from the substrate surface than the second peak 47.

FIGS. 17 to 25 illustrates, in cross-section, some of the major steps in the manufacture of the CMOS IC device of FIG. 16 in accordance with the first embodiment of this invention.

First, a buried element isolation technique is used for element isolation on the substrate 21 of either N type or P type conductivity.

Figure 17:
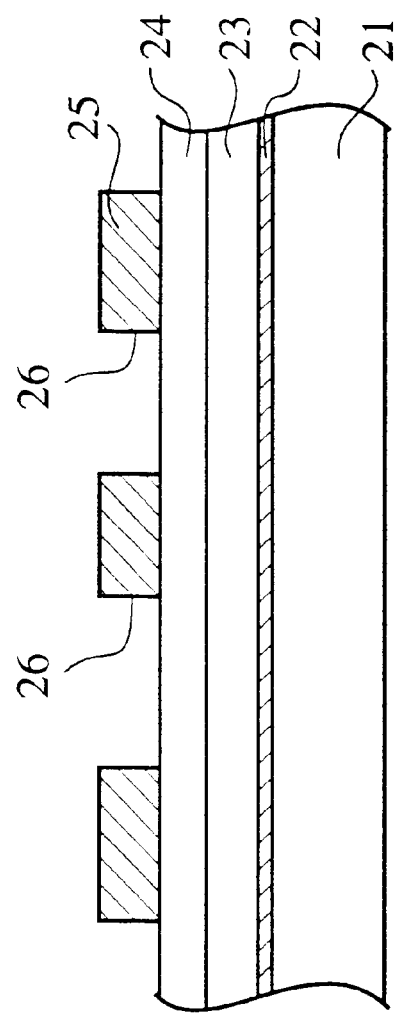
FIGS. 17–25 illustrate, in cross-section, some of the major steps in the manufacture of the semiconductor device embodying the instant invention.

More specifically, as shown in FIG. 17, a buffer oxide film 22 is formed on the substrate 21 to a thickness of, for example, 35 nanometers (nm). Then, a first stopper layer 23 for use during CMP process is deposited on the buffer oxide film 22. The stopper layer 23 may be made of a chosen material such as SiN or polycrystalline silicon (polysilicon) lower in CMP polishing rate than the oxide film. Next, a mask layer 24 is deposited on the first stopper layer 23. The mask 24 may be a TEOS oxide film or the like. A resist layer 25 is then deposited on the mask 24. Next, this resist 25 is patterned so that only selected regions in which 26 will be later formed are exposed due to removal of resist components thereon.

Figure 18:
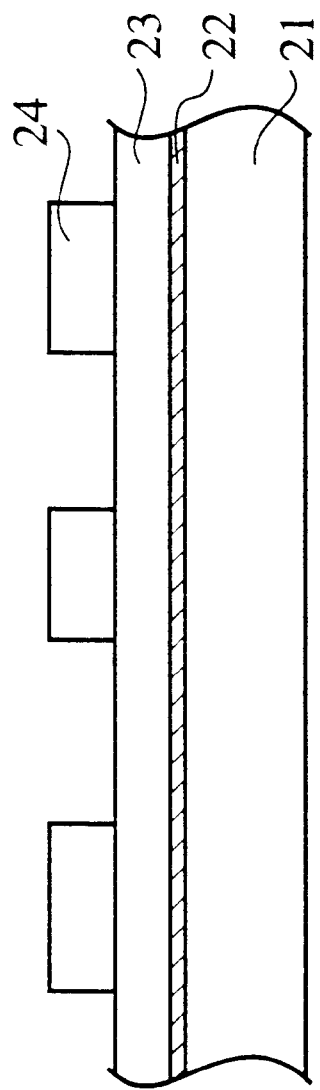

Subsequently, as shown in FIG. 18, while the patterned resist 25 is used as a mask, the mask layer 24 is selectively removed. Thereafter, the resist 25 is peeled off.

Figure 19:
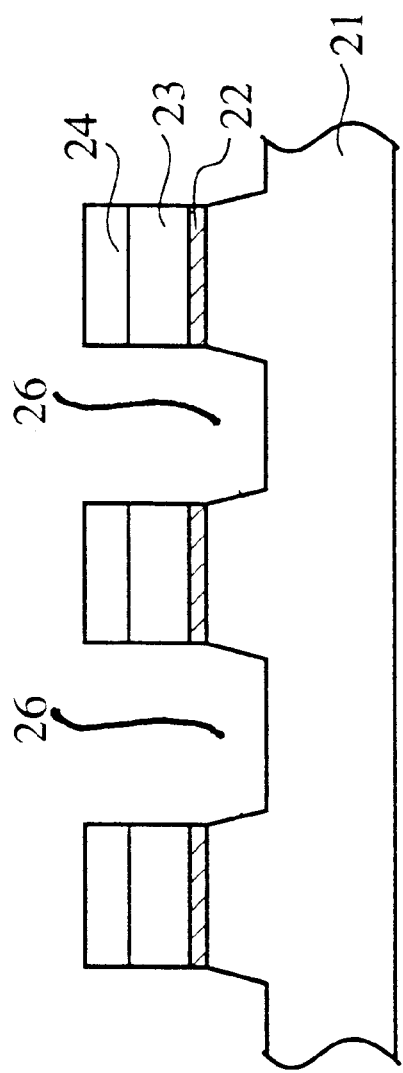

Next, as shown in FIG. 19, the first stopper layer 23 and oxide film 22 are sequentially etched with the resultant mask 24 being as a mask.

Figure 20:
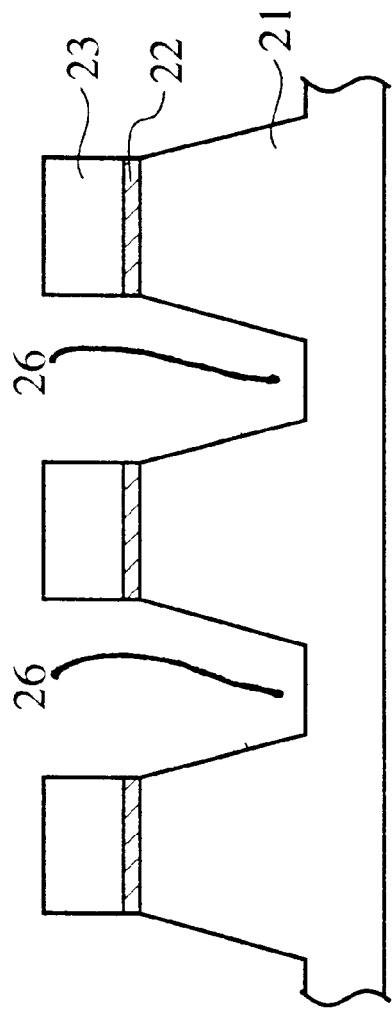

Further, as shown in FIG. 20, the substrate 21 is etched, forming trenches 26 in the surface of substrate 21.

Subsequently, the mask layer 24 overlying the first stopper layer 23 is peeled off.

Figure 21:
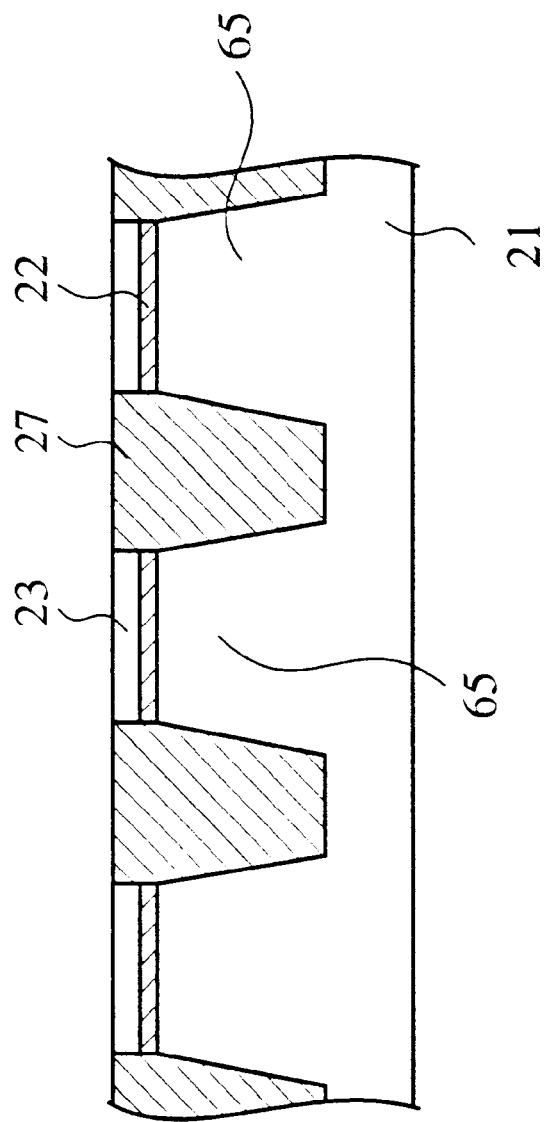

Then, as shown in FIG. 21, the inside of each buried trenches 26 is thermally oxidized, causing an oxide film such as TEOS or the like to be deposited within the trenches 26, thus providing a buried oxide film 27, and separating the semiconductor substrate 21 into an element formation region 65 having first and second conductivity types. The element formation region 65 defines a well region. Thereafter, the resulting structure is surface-planarized by chemical mechanical polishing (CMP) techniques.

Figure 22:
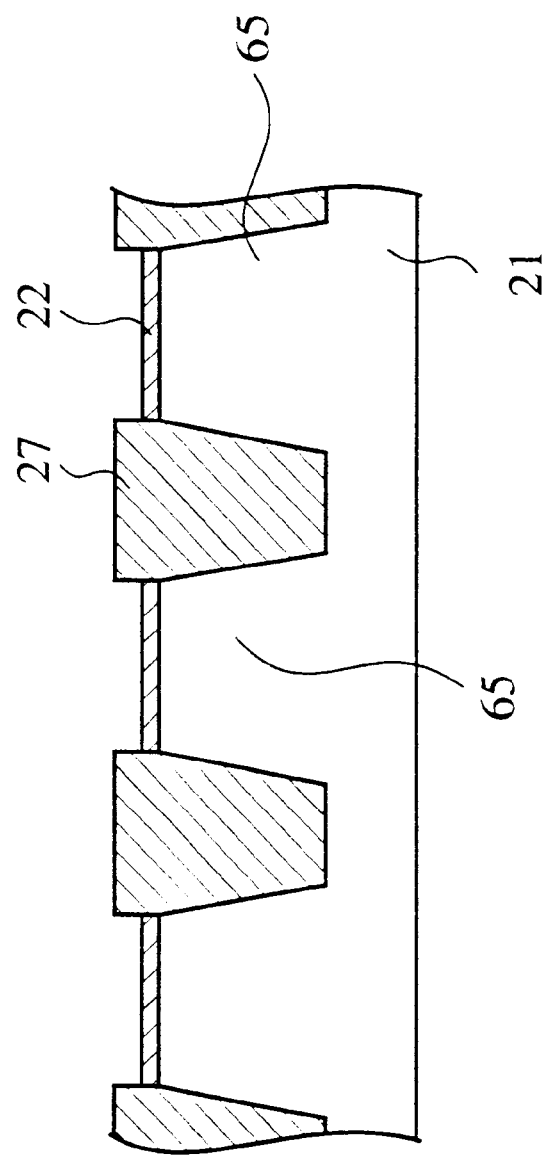

Next, as shown in FIG. 22, the first stopper layer 23 is removed away by peel-off using wet etching techniques.

Figure 23:
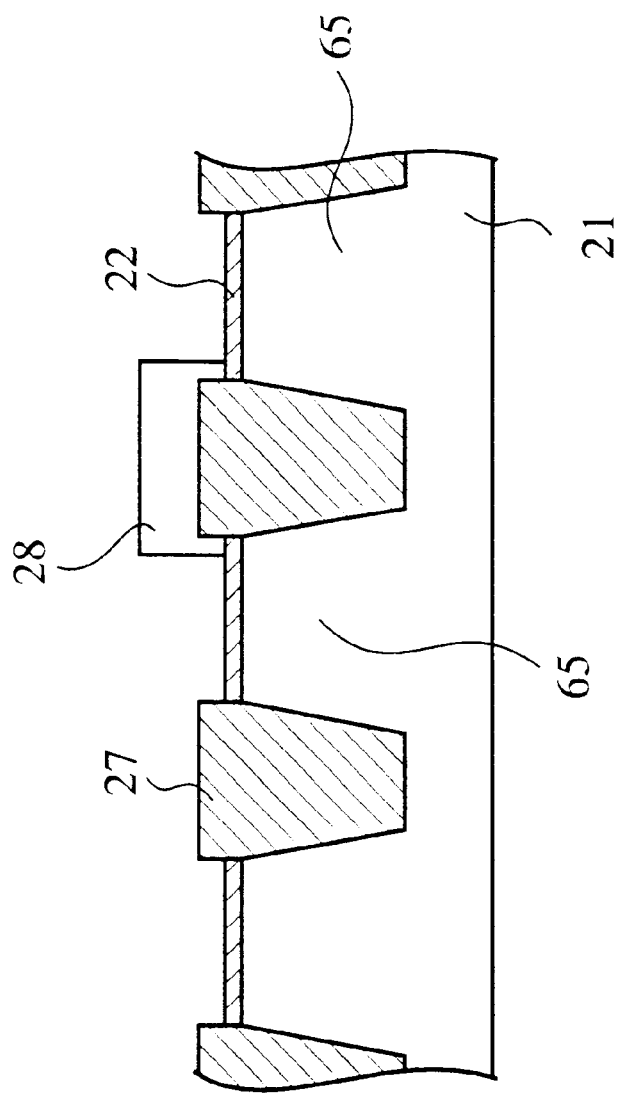

Next, as shown in FIG. 23, a film made of a chosen material is formed on the buried oxide films 27 and buffer oxide film 22 to a predetermined thickness. The film is then selectively removed, forming an ion deceleration layer 28 for use during an ion implantation process. The ion deceleration layer 28 is deposited on the buried oxide film 27 while the remaining portions thereof overlying those regions other than a well boundary region are selectively removed. Here, the decelerator layer 28 is designed to have a carefully selected thickness that permits dopant ions, when impurity ions are doped or implanted passing through the decelerator 28 into the substrate 21, to exhibit a concentration peak in the resulting impurity profile, which peak is shifted in level or "offset" toward the semiconductor substrate surface. For example, in the case the decelerator layer 28 is made of SiN, the film thickness may be determined so as to cause the resultant impurity concentration peak to be at a level exactly half of the depth of buried dielectric film 28. Preferably, the decelerator layer 28 may be made of a chosen material that has certain etching selection ratio relative to its underlying $SiO_2$, such as for example SiN, polysilicon, amorphous silicon, silicide or the like.

Figure 24:
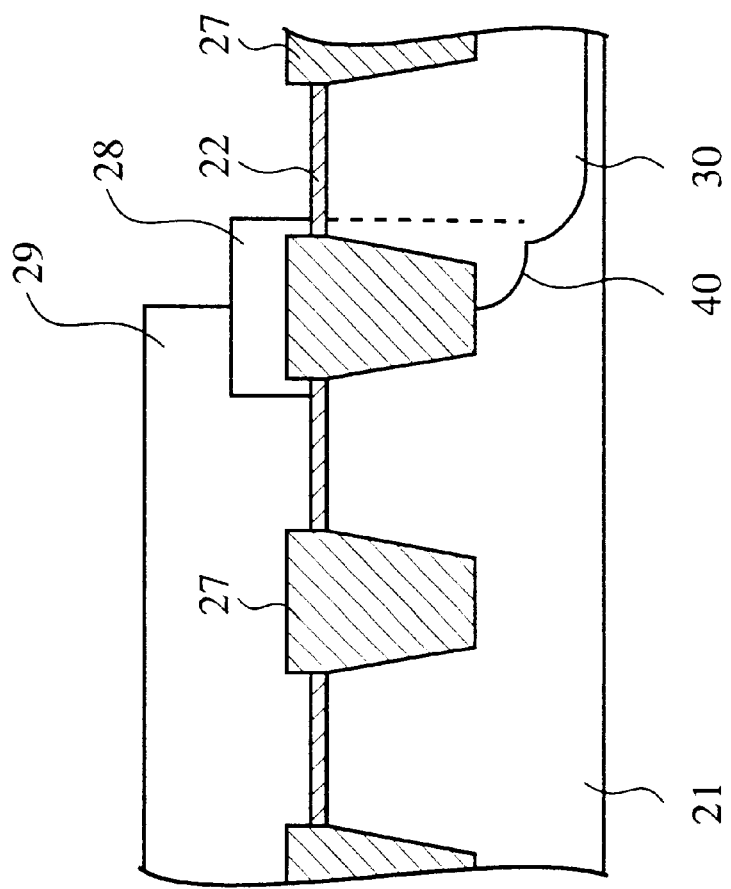

Next, as shown in FIG. 24, a patterned resist layer 29 having an opening above the P-well region 30 is formed on the semiconductor substrate surface. Next, with the resist 29 and ion decelerator layer 28 operating as a mask, ion implantation is carried out to form a P-well region in substrate 21. Importantly, this ion implantation is to be done through two separate process steps. The "first" ion implantation step is for forming an impurity concentration peak that is laid at an approximately intermediate location of the buried oxide film 27 along the depth thereof. The "second" ion implantation step is to form an impurity concentration peak at or near the bottom of the buried oxide film along with an impurity concentration peak near or around the bottom of such well region.

The first-step ion implantation is performed with respect to part of the P type well formation region 30 above which the ion decelerator layer 28 is not disposed, under the condition that the resulting impurity concentration peak is near the buried oxide film bottom surface. One example is that when the depth of the buried oxide film 27 is set at 0.7 $\mu$m, a setting is done causing the peak concentration of 1.0 to $5.0 \times 10^{17}$ $cm^{-3}$ to be at a location approximately 0.8 $\mu$m deep. When this is done, the peak of impurity concentration is at or near the intermediate level of the buried oxide film 27 in a well boundary region 40. By way of example, when the buried oxide film depth is 0.7 $\mu$m, the shift amount is 0.35 $\mu$m; thus, the peak position is 0.45 $\mu$m deep.

The second-step ion implantation is effectuated under the condition that the resultant impurity concentration peak is near the bottom surface of the buried oxide film 27 in the (P type) well boundary region 31 with the ion decelerator layer 28 being disposed thereabove. For instance, when the depth of the buried oxide film 27 is 0.7 $\mu$m, the peak concentration of 1.0 to $5.0 \times 10^{17}$ $cm^{-3}$ is at a level of 0.8 $\mu$m depth in the P well boundary region 40, whist the peak is at a level 1.15 $\mu$m deep from the substrate surface in the P-well region 30 with no ion decelerator layer 28 formed.

Thereafter, although not depicted in FIG. 24, similar ion implantation processing is also performed with respect to the N type well region. More specifically, after the intended ion implantation is carried out on the side of the P-wells 30, 40, the resist 29 is peeled off; then, a resist (not shown) is deposited on the side of P-wells 30, 40. After this was done, the first ion implantation is performed for the N-well side under the condition that an impurity concentration peak is near the buried oxide film bottom surface in the region 31 excluding an N-well boundary region with no ion decelerator layer 28 disposed thereon. Subsequently, the second ion implantation is done, letting an impurity peak be near the bottom surface of the buried oxide film 27 in the N-well boundary region 40.

In the way described above, ion implantation is performed for a respective one of the P-well regions 30, 40 and N-wells 31, 41. Thereafter, the ion decelerator layer 28 is peeled off. Then, the buffer oxide film 22 is peeled off. Next, gate oxidation processing is carried out.

Figure 25:
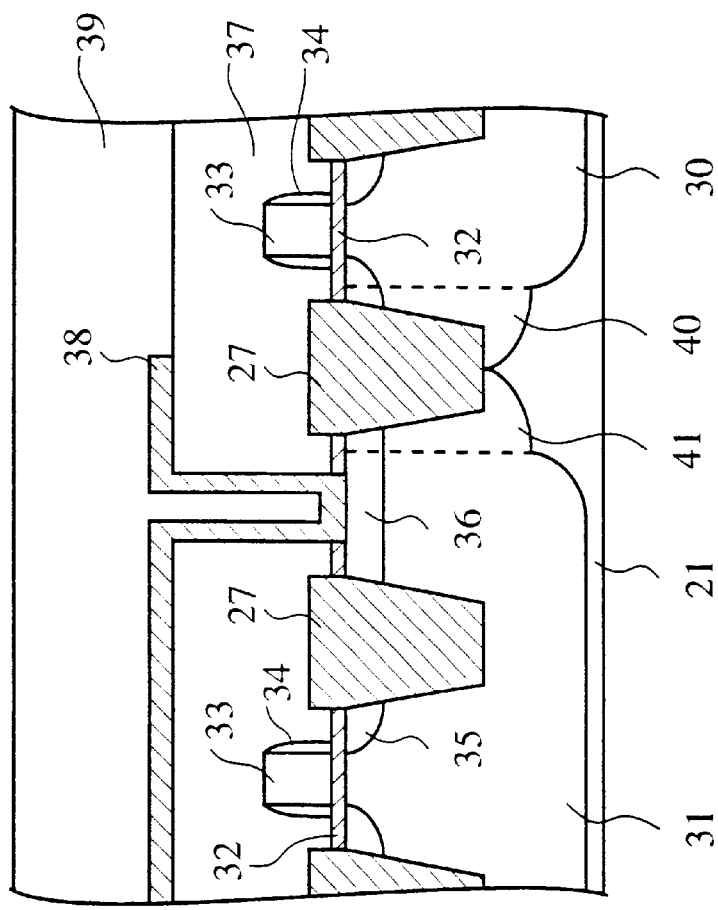

Thereafter, gate electrode formation and diffusion layer formation as well as interlayer dielectric layer/chip lead pattern formation are performed sequentially thus completing the intended CMOS IC device with its cross-sectional structure shown in FIG. 25.

More specifically, a gate oxide film 32 is formed on the surface of the substrate 21; then, a gate electrode 33 is formed thereon. Subsequently, ion implantation is performed forming a drain with the LDD structure (not shown) in the surface of substrate 21. After formation of sidewalls 34 on the opposite sides of the gate electrode 33, ion implantation and thermal processing are carried out to thereby form diffusion layers 35 and 36 in the substrate surface, which are self-aligned with gate electrode 33. Then, an insulative film 37 made of SiO2 or equivalents thereto is deposited on the entire substrate surface, thereby providing a first interlayer dielectric film. The dielectric film 37 is then selectively removed only at certain regions selected for electrical interconnection, thereby forming contact holes therein. A patterned conductive material is formed on the dielectric film 37, thereby providing a first chip lead pattern 38.

Thereafter, further second and third laminations of interlayer dielectric films and chip lead patterns may be formed where necessary, although not particularly illustrated herein. After completion of forming these lead patterns, a protective film 39 is then formed on the resultant structure covering or coating the surface thereof to thereby complete the CMOS IC device embodying the invention.

One feature of the first embodiment of the invention is that while the retrograde well region is employed which makes it possible to achieve low threshold value and low junction capacitance, the "impurity concentration peak location control" feature may enable accomplishment of increased or maximized element isolation breakdown voltage characteristics due to the fact that the impurity concentration profile in the substrate comes with multiple impurity peaks, including a first peak placed at a level substantially half of the depth of its associative buried oxide film in the vicinity of a well boundary region, and a second peak near the buried oxide film bottom surface, to thereby suppress or minimize the operability of an inherently existing vertical parasitic MOS transistor element.

Another advantage of the illustrative embodiment is that the intended well region may be formed more deeply than before because of the presence of an additional, fourth impurity concentration peak at a level deeper than the buried oxide film bottom surface in the element formation region other than the well boundary nearby region. This may enable the well to decrease in resistivity while suppressing any local well potential variation otherwise occurring due to electrical noises, which in turn makes it possible to enhance the latchup withstanding characteristics of CMOS IC device.

Figure 26:
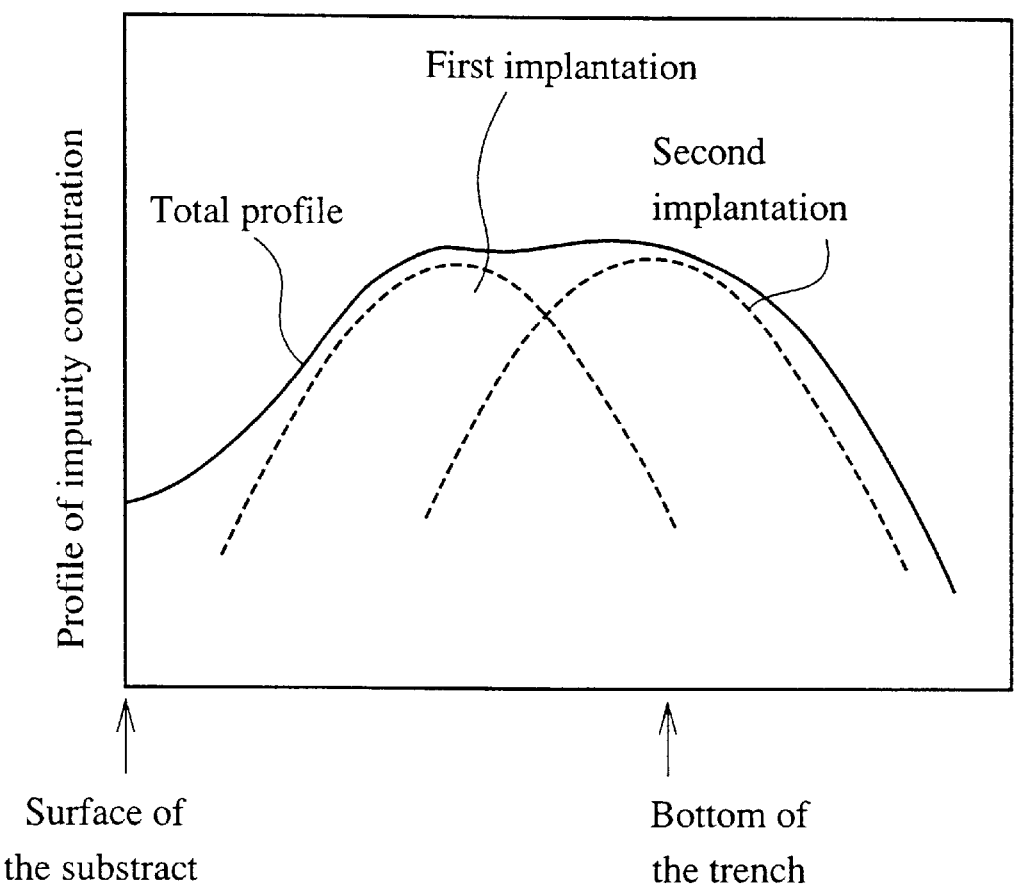
Figure 27:
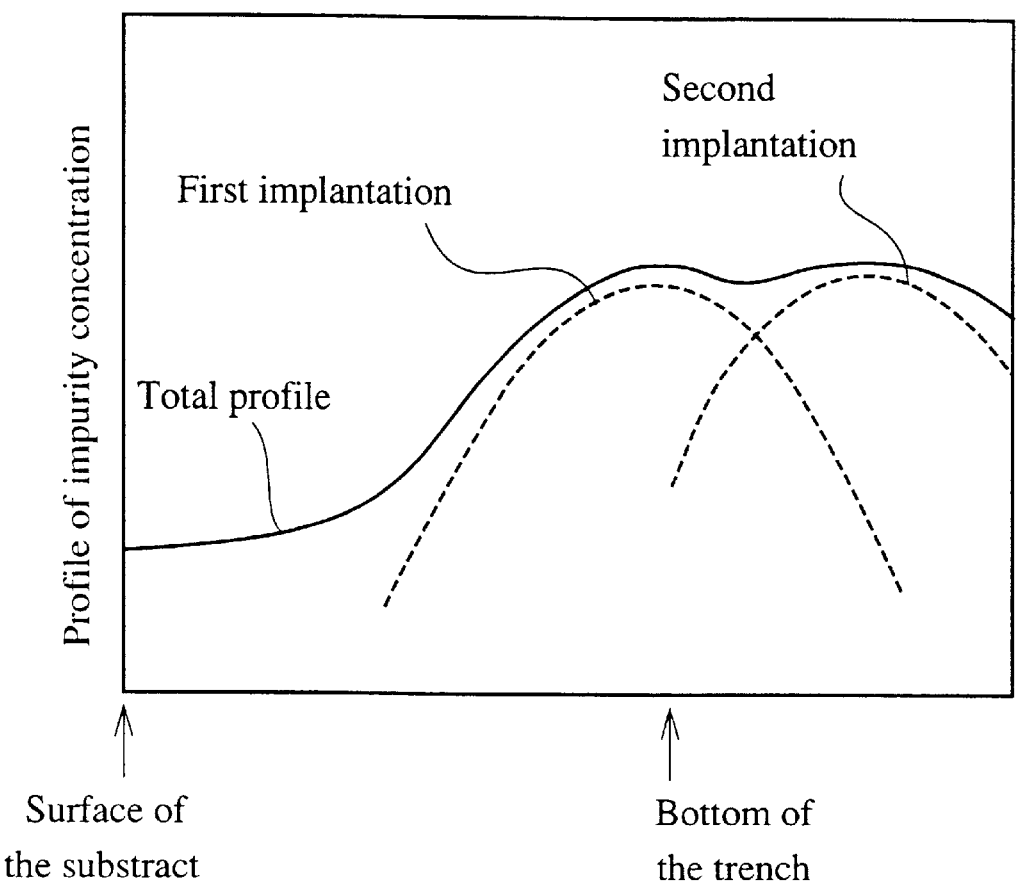

The resulting impurity concentration profile of the well regions thus formed is demonstrated in FIGS. 26–27, wherein FIG. 26 is a graph showing one typical impurity concentration profile in the P-well boundary region 40 whereas FIG. 27 is a graph showing a profile in the region 30 other than the P-well region.

It would be readily appreciated to those skilled in the art from viewing the FIG. 26 graph that regarding the P-well boundary region 40, the intended retrograde well is formed therein at the second ion implantation step, and that the well impurity concentration is increased through the first ion implantation to suppress operability of a parasitic MOS transistor element. This results in presence of the second peak near the bottom surface of the buried oxide film 27.

On the other hand, it is apparent from the FIG. 27 graph that in the region 30 excluding such P-well boundary region, the retrograde well has been formed by the first ion implantation. The second ion implantation results in formation of the fourth impurity concentration peak at a level sufficiently deep from the substrate surface, which minimally affects the impurity concentration in the substrate surface. As a result, it becomes possible to achieve the intended well structure capable of reducing both the threshold value and the junction capacitance while at the same time increasing the element isolation breakdown characteristics.

In addition, execution of the second-step ion implantation causes the second peak to exist at a level deeper than the bottom surface of buried oxide film 27 in the P-well region 30. This results in a decrease in electrical resistivity of the well, which may in turn eliminate, or at least greatly suppress, any possible well potential variations due to application of electrical noises, thus enhancing the latchup withstanding characteristics.

Furthermore, unlike the prior art separate well implanting process scheme which requires additional use of two extra masks and two separate lithography process steps as stated above, the present invention may permit the intended well structure to be fabricated by employing a single mask for use in patterning the ion decelerator layer with only a single lithography process step being added thereto.

An explanation will next be given of a second preferred embodiment of the invention with reference to FIGS. 28–34.

Figure 28:
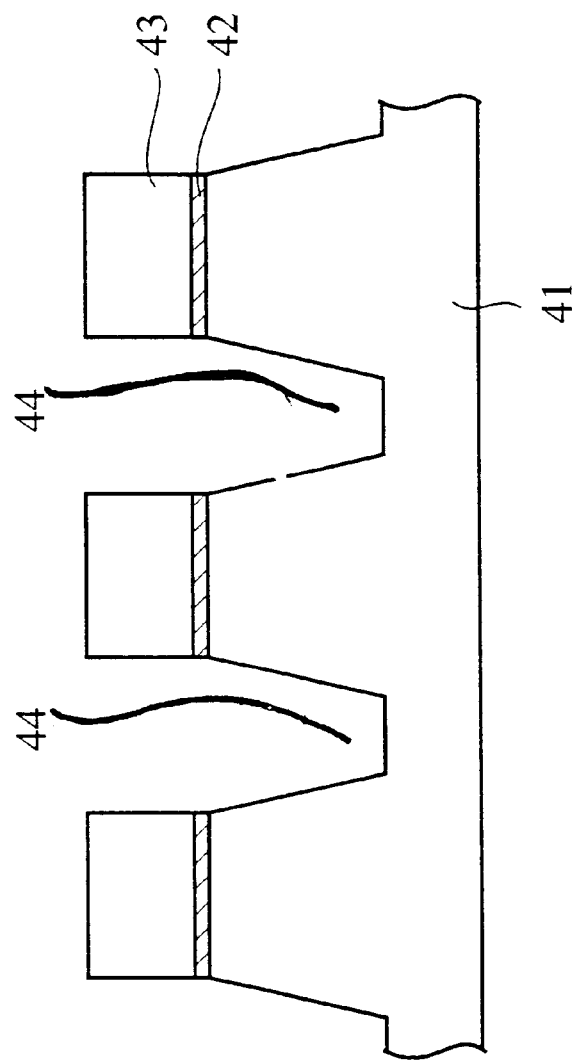
FIGS. 28–34 depict, in cross-section, some of the major steps in the manufacture of the semiconductor device in accordance with a further embodiment of the invention.

Firstly, as shown in FIG. 28, a buffer oxide film 42 is formed on a semiconductive substrate of N type or P type conductivity, to a predefined thickness of, for example, 35 nm. Then, a first CMP stopper later 43 is deposited thereon, which may be made of a chosen material lower in polishing rate than the buffer oxide film 42, such as, for example, SiN, polysilicon or the like. The thickness of this first stopper layer 43 may be determined to ensure that when well formation ion implantation is performed through an element isolation oxide film partly projecting to the extent that corresponds to the residual film portions of the first stopper layer 43 after CMP processing as will be described later, the resultant impurity concentration peak is shifted in level or "offset" by a specific distance almost half the depth of its associative buried oxide film.

After a TEOS film (not shown) is deposited as a mask layer, a resist layer is coated and then patterned to have a specified pattern with openings at locations in which trenches 44 will be later formed. After such patterning, the mask layer is selectively removed. Next, the resist is peeled off. Then, the first stopper 43 and buffer oxide film 42 are etched in this order. Further, trenches 44 are formed in the substrate 41.

Figure 29:
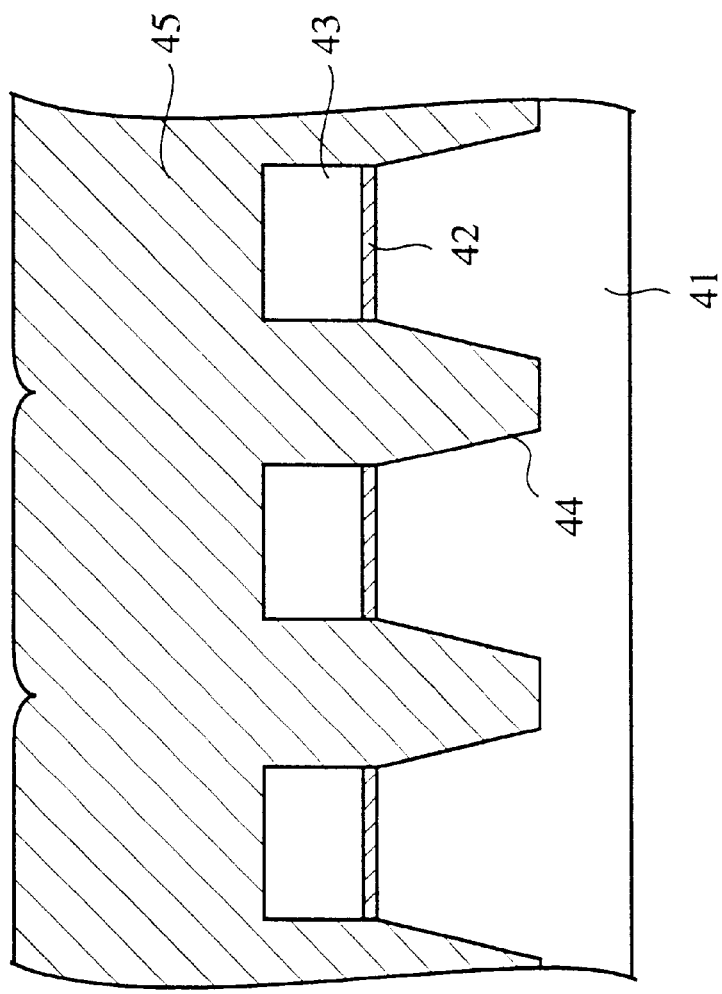

Then, as shown in FIG. 29, the inside of each trench 44 is oxidized. An oxide film 45 of TEOS or the like is deposited covering the individual trench 44.

A chosen material of low polishing rate is deposited, which is then selectively removed at certain portions other than those regions in which the trenches 44 are present with a large area, thereby forming a second stopper layer. Note that such second stopper will not necessarily be required in cases where no such large-area buried oxide films are present: in view of this, depiction of the second stopper is eliminated herein.

Figure 30:
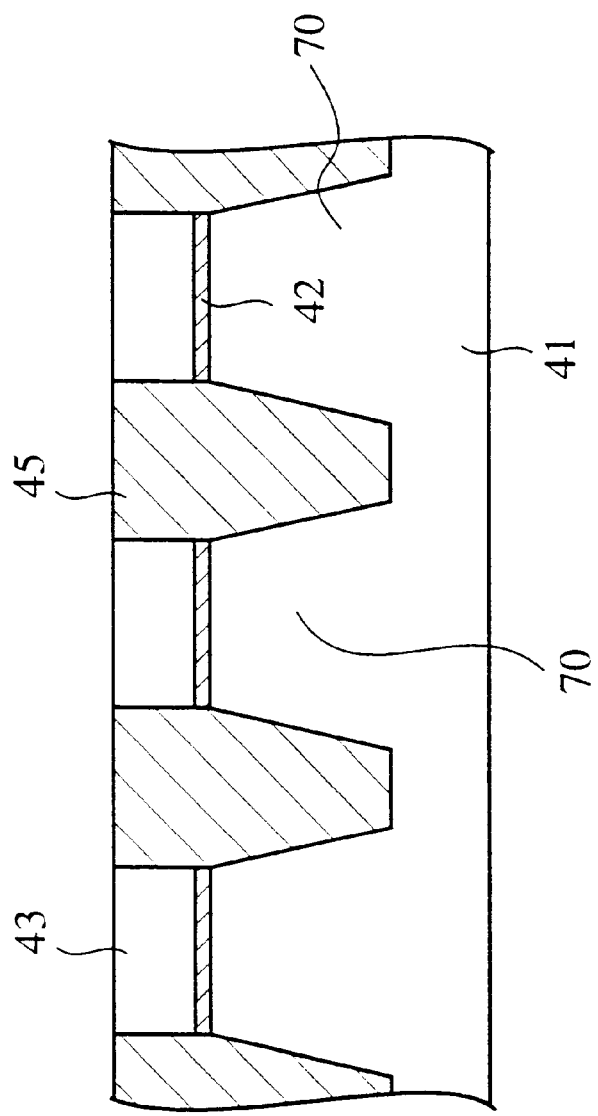
Figure 31:
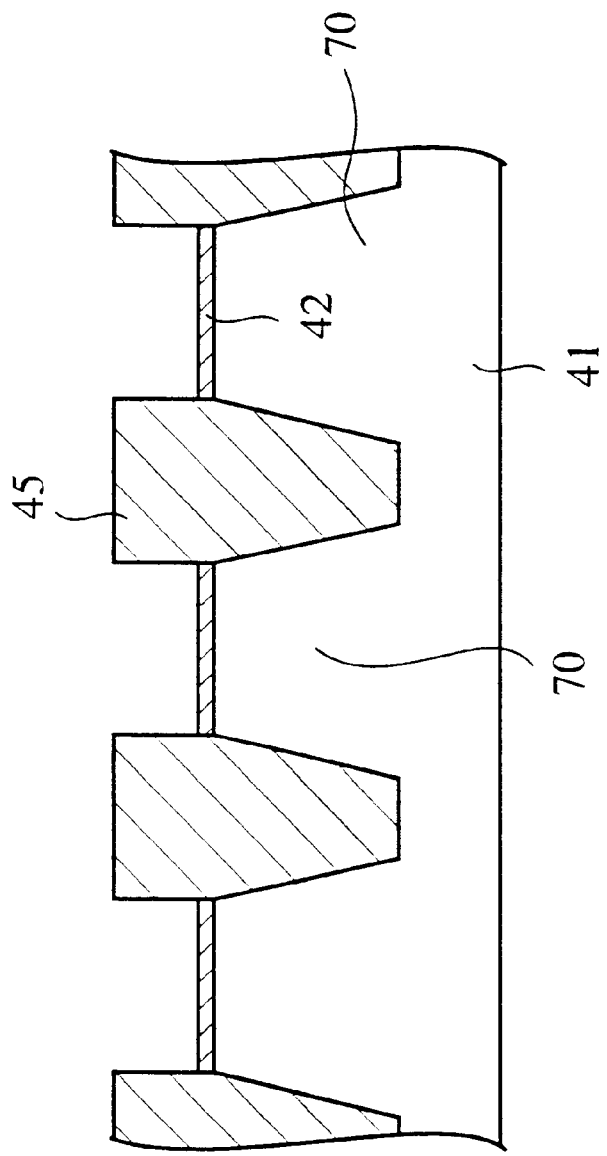

Next, as shown in FIG. 30, CMP processing is performed for surface planarization of the entire surface of the resulting structure. A buried oxide film 45 within the trenches is formed by separating the semiconductor substrate 41 into an element formation region 70 having first and second conductivity types. The element formation region 70 defines a well region. Thereafter, as shown in FIG. 31, the first stopper layer 43 is peeled off.

Figure 32:
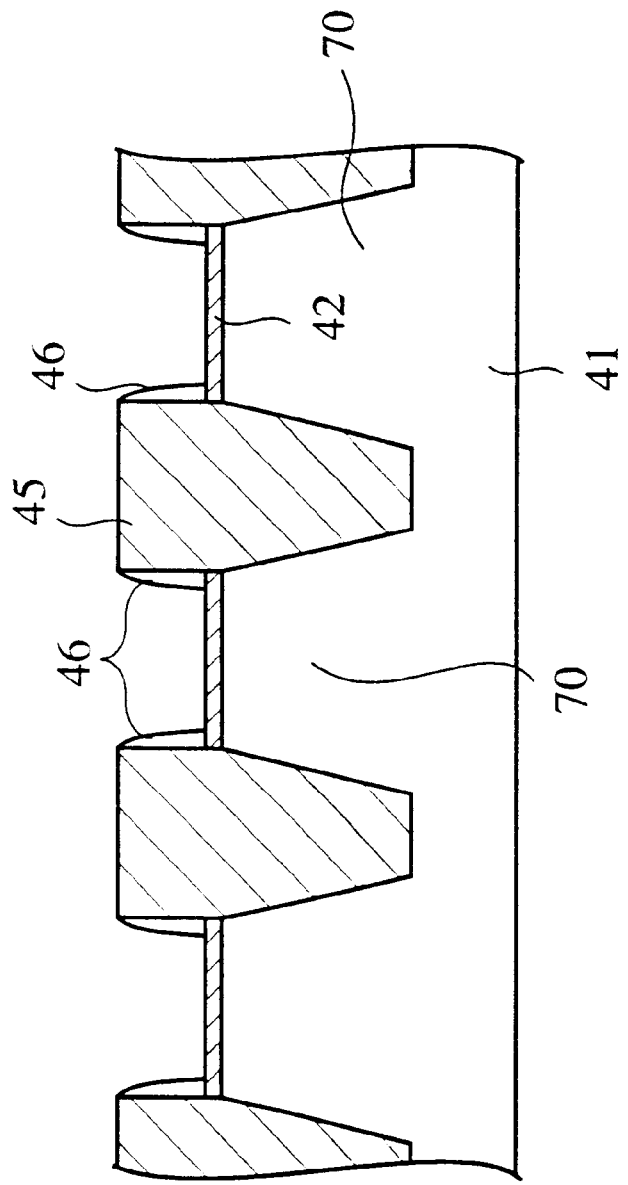

After deposition of a preselected material (such as for example SiN, oxide film, polysilicon, or the like), anisotropic etching, such as reactive ion etching (RIE), is done forming sidewalls 46 on the opposite sides of each oxide film 45, as shown in FIG. 32.

As apparent from FIG. 32, the individual trench 44 has at its upper portion whereat a projected film consisting of the buried oxide film 45 is formed. This state may be equivalent in structure to the first embodiment shown in FIG. 23. More specifically, the certain "projected" part that consists essentially of the oxide film 45 projected upward from the buffer oxide film 42 and the sidewalls 46 thereof may correspond to the ion decelerator 28 shown in FIG. 23. Accordingly, as readily understandable to those skilled in the art, execution of well ion implantation in this state results in achievement of substantially the same advantages as in the first embodiment stated above.

Additionally, the width of each sidewall 46 is determinable depending on how wide the range spanning from the well boundary region is required for presence of a heavily-doped well region.

Figure 33:
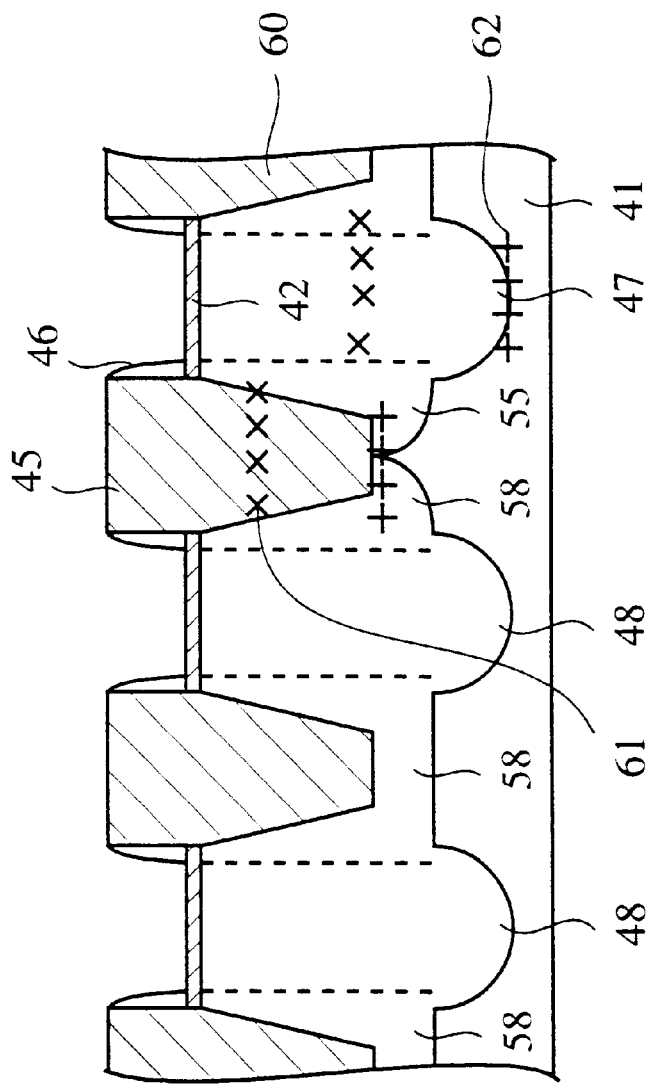

The resulting structure with the required well regions formed is depicted in FIG. 33.

As in the first embodiment described previously, the individual one of P type well region 47 and N type well region 48 is formed through two separate steps of ion implantation. One typical example is that at a boundary 57 of P-well region 47 in which the buried oxide film 45 and sidewalls 46 are not formed, the "first" ion implantation is performed under the condition that causes an impurity concentration peak 60 is near the buried oxide film bottom surface. Subsequently, in the P-well region 47 with the buried oxide film 45 and its sidewalls 46 formed, the "second" ion implantation is done under the condition that causes an impurity concentration peak 62 is at a location far deeper than the buried oxide film—say, near the semiconductor substrate bottom surface. Through the foregoing two separate ion implantation steps, the first impurity concentration peak 61 is formed in the P-well boundary region 57 at a level approximately half the depth of the buried oxide film measured from the substrate surface, whist the second impurity concentration peak 64 is at a different level at or near the bottom of such buried oxide film 45 as best illustrated in FIG. 33.

Similarly, in an N-well region 48 in which the buried oxide film 45 and its sidewalls 46 are absent, the "first" ion implantation is carried out under the condition that causes an impurity concentration peak 62 is at or near the buried oxide film bottom surface. Subsequently, in the N-well region 48 with the buried oxide film 45 and sidewalls 46 formed, the "second" ion implantation is done under the condition that causes an impurity concentration peak is at a location deeper than the buried oxide film—say, near the semiconductor substrate bottom surface. Through the two separate ion implantation steps, the first impurity concentration peak is formed in the P-well boundary region 58 at a level substantially half the depth of the buried oxide film measured from the substrate surface, whereas the second impurity concentration peak is at a level at or near the bottom of buried oxide film 45 as shown in FIG. 33.

It is noted that in some cases, the intended effects are obtainable even where the sidewalls 46 are absent. This will typically happen in the case the individual trench 44 has its side surfaces tapered, by way of example. If this is the case, sidewalls 46 are no longer required.

It is also noted that the step-like surface difference amount—i.e. a height difference between the substrate surface and the top surface of buried oxide film 45 as projected therefrom, which difference may correspond to the thickness of the ion decelerator film 28 of the first embodiment discussed earlier—is controllable depending on the practically designed film thickness of the first stopper layer 43. As far as the same ion implantation condition is established, the expected concentration peaks of ions implanted may be kept substantially unchanged in position between the silicon substrate and the oxide films. Consequently, one optimal step-like height difference amount may preferably be about 40 to 60 percent of the total depth of each buried oxide film, more preferably, almost half the buried oxide film depth (0.3 to 0.4 µm if the buried film thickness is 0.7 µm).

The film thickness Tf of the first stopper layer 43 may typically be given as: Tf=Td+α, where Td is the target step-like difference amount, and α is the possible thickness reduction through etching, which may typically be 50 nm. In other words, the film thickness of such first stopper 43 may be set at a value of half (½) the buried oxide film depth plus a presumable thickness reduction during etching. One example is that when the buried oxide film thickness is 0.7 µm, the stopper thickness may be 0.35 µm+0.05 m=0.4 µm.

Note here that this value is one best possible optimal mathematical solution; accordingly, even where a step-like difference less in value than the above is attained when reduction to practice of the principles of the invention, it still remains possible to permit the well profile to offset deeply from the substrate surface—by a depth corresponding to such practical step-like difference—in those regions other than the well boundary, which may advantageously serve to let the impurity concentration in the substrate surface be less than that in such well boundary region.

After the P-well regions 47, 57 and N-wells 48, 58 are formed as shown in FIG. 33 in the way described above, the sidewalls 46 are peeled off; then, the upper "projected" or protuberance part of each buried oxide film 45 is etched back by appropriate resist etch-back techniques or the like.

This etchback process is done to eliminate any residual portions of an electrode material at such step-like difference portions on the substrate surface during formation of gate electrodes thereon, which can otherwise take place due to presence of an excessive height difference between the "projected" buried oxide films 45 projecting upward from the buffer oxide films 42 and the substrate surface in element formation regions. Obviously, such etchback processing is not necessary if no or less step-like differences are present on the substrate surface.

Figure 34:
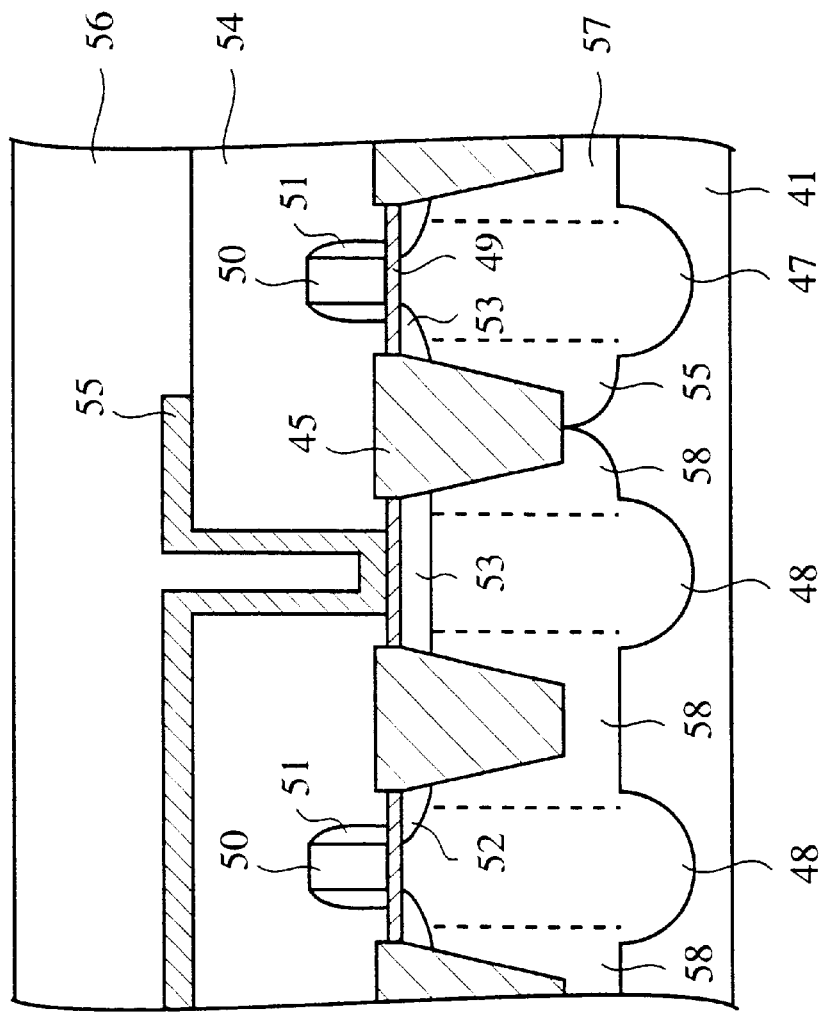

Thereafter, peel-off of the oxide film 42 and gate oxidation are effectuated thus completing the CMOS IC device in a way similar to that in the first embodiment discussed supra. More specifically, as shown in FIG. 34, a gate oxide film 49 is formed on the surface of the substrate 41; then, a gate electrode 50 is formed thereon. Subsequently, ion implantation is done, forming an LDD (not shown) in the surface of substrate 41. Thereafter, sidewalls 51 are formed. And, ion implantation and thermal processing are performed forming diffusion layers 52 and 53.

Then, an insulative film 54 made of, for example, SiO2, is entirely deposited on the substrate providing a first interlayer dielectric film. This dielectric film is then selectively removed by selective etching techniques at those selected portions whereat electrical interconnections are made, thereby forming therein contact holes. Here, a patterned conductive layer is formed on the dielectric film 54 to thereby provide a first chip lead pattern layer 55. Second and third laminations of interlayer dielectric films and chip lead patterns may be formed where necessary. After formation of such chip lead patterns laminated, the resultant structure is entirely coated on its top surface with a protective film 56 of SiN or the like, to thereby complete the CMOS IC device.

With the second embodiment method and device also, use of the retrograde well may reduce the transistor threshold value and the junction capacitance thereof while simultaneously rendering inoperative any inherent vertical parasitic MOS transistor elements to thereby improve the element isolation breakdown characteristics, with the well-region resistivity being reduced in element formation regions excluding well region boundary nearby locations, which may in turn increase or maximize the latchup withstanding characteristics accordingly.

One advantage of the second embodiment over the first embodiment is that any extra masks and lithography process steps are no longer required while enabling achievement of more precise self-alignment setup configurations, which in turn permits the well-region boundary regions to be accurately self-aligned with the element isolation regions.

A further advantage is that while the first embodiment requires strict margins for pattern alignment of the ion decelerator layer used, it is permissible for the second embodiment to neglect such alignment margins due to avoidance of the need for the decelerator layer.

It has been described that in accordance with the CMOS IC device and manufacturing method incorporating the principles of the present invention, it becomes possible to reduce complexity in the manufacture of a well structure with the well profile at well boundary nearby locations being different from that in the element formation regions, which in turn leads to capability of achievement of low threshold value and low junction capacitance while sufficiently increasing the isolation breakdown voltage characteristics between adjacent ones of the well regions in the substrate.

While there has been illustrated and described what are presently considered to be preferred embodiments of the present invention, it will be understood by those skilled in the art that various changes and modifications may be made, and equivalents may be substituted for devices thereof without departing from the true scope of the invention. In addition many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A MOS semiconductor device having a shallow trench isolation region, said device comprising:

a semiconductor substrate;

a first well region of a first conductivity type and a second well region of a second conductivity type in said semiconductor substrate; and an element isolation dielectric film between said first well region and said second well region; and said first well region having a first region facing said element isolation dielectric film, and a second region different from said first region;

wherein said first region has an impurity profile with a first concentration peak and said second region has a third concentration peak positioned farther away from said top surface of said substrate than said first concentration peak, and wherein said first region has a second concentration peak and said second region has a fourth concentration peak positioned farther away from said top surface of said substrate than said second concentration peak.

2. A MOS semiconductor device having a shallow trench isolation region, said device comprising:

a semiconductor substrate;

a first well region of a first conductivity type and a second well region of a second conductivity type in said semiconductor substrate; and an element isolation dielectric film between said first well region and said second well region;

said first well region having a first region facing said element isolation dielectric film, and a second region different from said first region, wherein said first region has an impurity profile with a first concentration peak positioned approximately half the depth of said element isolation dielectric film measured from the top surface of said substrate, and a second concentration peak positioned farther away from said top surface of said substrate than said first concentration peak and near a bottom of said element isolation dielectric film, a concentration profile of an area between said first concentration peak and said second concentration peak is deeper than a concentration profile of an area between said first concentration peak and said top surface of said substrate, and wherein said second region has a third concentration peak, said third concentration peak being positioned farther away from said top surface of said substrate than said first concentration peak, and a fourth concentration peak which is formed simultaneously with said second concentration peak and positioned farther away from said top surface of said substrate than said second concentration peak, and a concentration profile of an area between said third concentration peak and said fourth concentration peak deeper than a concentration profile of an area between said third concentration peak and said top surface of said substrate.

3. The MOS semiconductor device according to claim 2, wherein said second and third concentration peaks are positioned near the bottom of said element isolation dielectric film.

4. The MOS semiconductor device according to claim 2, wherein said fourth concentration peak is near said bottom surface of said semiconductor substrate.

* * * * *